(12) United States Patent
Ni

(10) Patent No.: US 11,907,806 B2
(45) Date of Patent: Feb. 20, 2024

(54) PARAMETER CALIBRATION METHOD AND SYSTEM, QUANTUM CHIP CONTROL METHOD

(71) Applicant: Alibaba Singapore Holding Private Limited, Singapore (SG)

(72) Inventor: Xiaotong Ni, Hangzhou (CN)

(73) Assignee: Alibaba Singapore Holding Private Limited, Singapore (SG)

( * ) Notice: Subject to any disclaimer, the term of this patent is extended or adjusted under 35 U.S.C. 154(b) by 119 days.

(21) Appl. No.: 17/661,442

(22) Filed: Apr. 29, 2022

(65) Prior Publication Data

US 2022/0374754 A1 Nov. 24, 2022

(30) Foreign Application Priority Data

May 20, 2021 (CN) .......................... 202110553788.9

(51) Int. Cl.
*H03K 17/92* (2006.01)
*G06N 10/40* (2022.01)
*G06N 10/70* (2022.01)

(52) U.S. Cl.
CPC ............. *G06N 10/40* (2022.01); *G06N 10/70* (2022.01); *H03K 17/92* (2013.01)

(58) Field of Classification Search
CPC ...................................................... H03K 17/92
USPC .......................................................... 327/527
See application file for complete search history.

(56) References Cited

U.S. PATENT DOCUMENTS

2022/0366291 A1* 11/2022 Ni .......................... G06N 10/40

* cited by examiner

*Primary Examiner* — Tomi Skibinski
(74) *Attorney, Agent, or Firm* — Finnegan, Henderson, Farabow, Garrett & Dunner, LLP

(57) ABSTRACT

A parameter calibration method is provided. The parameter calibration method includes: obtaining a control parameter to be calibrated; determining a simulation running error corresponding to a quantum chip; determining calibration data corresponding to the control parameter to be calibrated based on the simulation running error; and obtaining a calibrated control parameter by calibrating the control parameter to be calibrated based on the calibration data, wherein the calibrated control parameter is used for controlling operation of the quantum chip.

20 Claims, 14 Drawing Sheets

PARAMETER CALIBRATION METHOD AND SYSTEM, QUANTUM CHIP CONTROL METHOD

CROSS-REFERENCE TO RELATED APPLICATIONS

The disclosure claims the benefits of priority to Chinese Application No. 202110553788.9, filed on May 20, 2021, which is incorporated herein by reference in its entirety.

TECHNICAL FIELD

The present disclosure relates to the field of quantum technology, and in particular, to a parameter calibration method and system, and a quantum chip control method.

BACKGROUND

A quantum chip is a chip that integrates quantum circuits on a substrate and perform a quantum information processing. In a field of quantum computing, quantum chips need to be controlled based on a chip parameter and a control parameter to implement quantum gate operations and to run quantum algorithms. However, some parameters for controlling the quantum chip change over time, for example, the chip parameter for controlling the quantum chip changes with time. The chip parameter obtained by measurement may also have an error.

SUMMARY OF THE DISCLOSURE

Embodiments of the present disclosure provide a parameter calibration method. The method includes: obtaining a control parameter to be calibrated; determining a simulation running error corresponding to a quantum chip; determining calibration data corresponding to the control parameter to be calibrated based on the simulation running error; and obtaining a calibrated control parameter by calibrating the control parameter to be calibrated based on the calibration data, wherein the calibrated control parameter is used for controlling operation of the quantum chip.

Embodiments of the present disclosure provide a parameter calibration system. The system includes a quantum chip; and a parameter calibration apparatus, connected to the quantum chip, and configured to: obtain a control parameter to be calibrated; determine a simulation running error corresponding to the quantum chip; determine calibration data corresponding to the control parameter to be calibrated based on the simulation running error; and obtain a calibrated control parameter by calibrating the control parameter based on the calibration data, wherein the calibrated control parameter is used for controlling operation of the quantum chip.

Embodiments of the present disclosure provide a quantum chip control method. The method includes: obtaining a first parameter and a second parameter which are used for controlling a quantum chip to perform operations, wherein the first parameter changes with a chip parameter of the quantum chip, and the second parameter does not change with the chip parameter of the quantum chip; determining calibration data corresponding to the first parameter, wherein the calibration data is determined based on a simulation running error corresponding to the quantum chip; calibrating the first parameter based on the calibration data to obtain a calibrated first parameter; and controlling, based on the calibrated first parameter and the second parameter, the quantum chip to perform an operation.

BRIEF DESCRIPTION OF THE DRAWINGS

Embodiments and various aspects of the present disclosure are illustrated in the following detailed description and the accompanying figures. Various features shown in the figures are not drawn to scale.

DETAILED DESCRIPTION

Reference can now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the disclosure. Instead, they are merely examples of apparatuses and methods consistent with aspects related to the disclosure as recited in the appended claims. Particular aspects of present disclosure are described in greater detail below. The terms and definitions provided herein control, if in conflict with terms and/or definitions incorporated by reference.

In order to calibrate parameters for controlling the quantum chip by a series of calibration operations and ensure the precision of control of the quantum chip, embodiments of present disclosure provide a method and an apparatus for parameter calibration, and a quantum chip control method.

In the parameter calibration method, by obtaining a control parameter to be calibrated, a simulation running error corresponding to a quantum chip is determined. Calibration data corresponding to the control parameter is determined based on the simulation running error, and the control parameter is calibrated based on the calibration data. The calibrated control parameter is used for controlling the quantum chip to perform an operation. In this way, the control parameter can be calibrated based on the simulation running error existed in the quantum chip, and the quantum chip can be controlled based on the calibrated control parameter. Therefore, the quality and efficiency of control of the quantum chip are ensured. Furthermore, the practicability of the parameter calibration method is improved.

Figure 1:
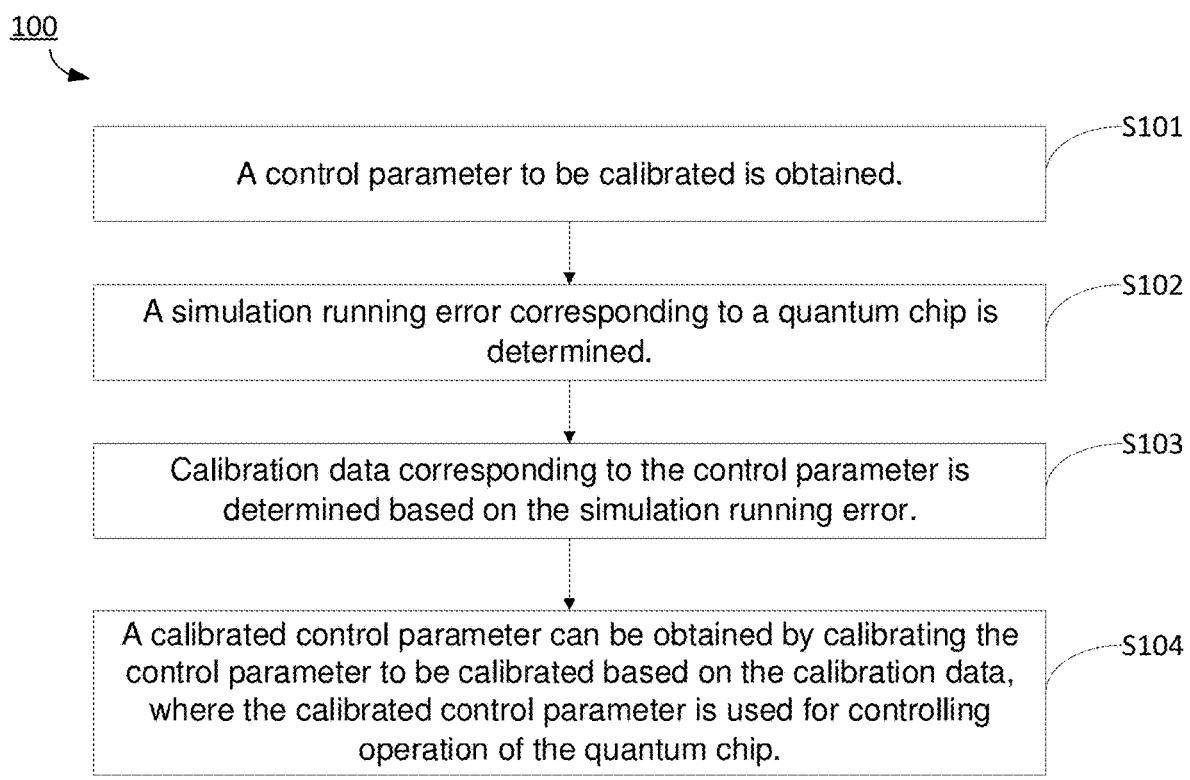
FIG. 1 is a schematic flowchart of an exemplary parameter calibration method, according to some embodiment of the present disclosure.
Figure 2:
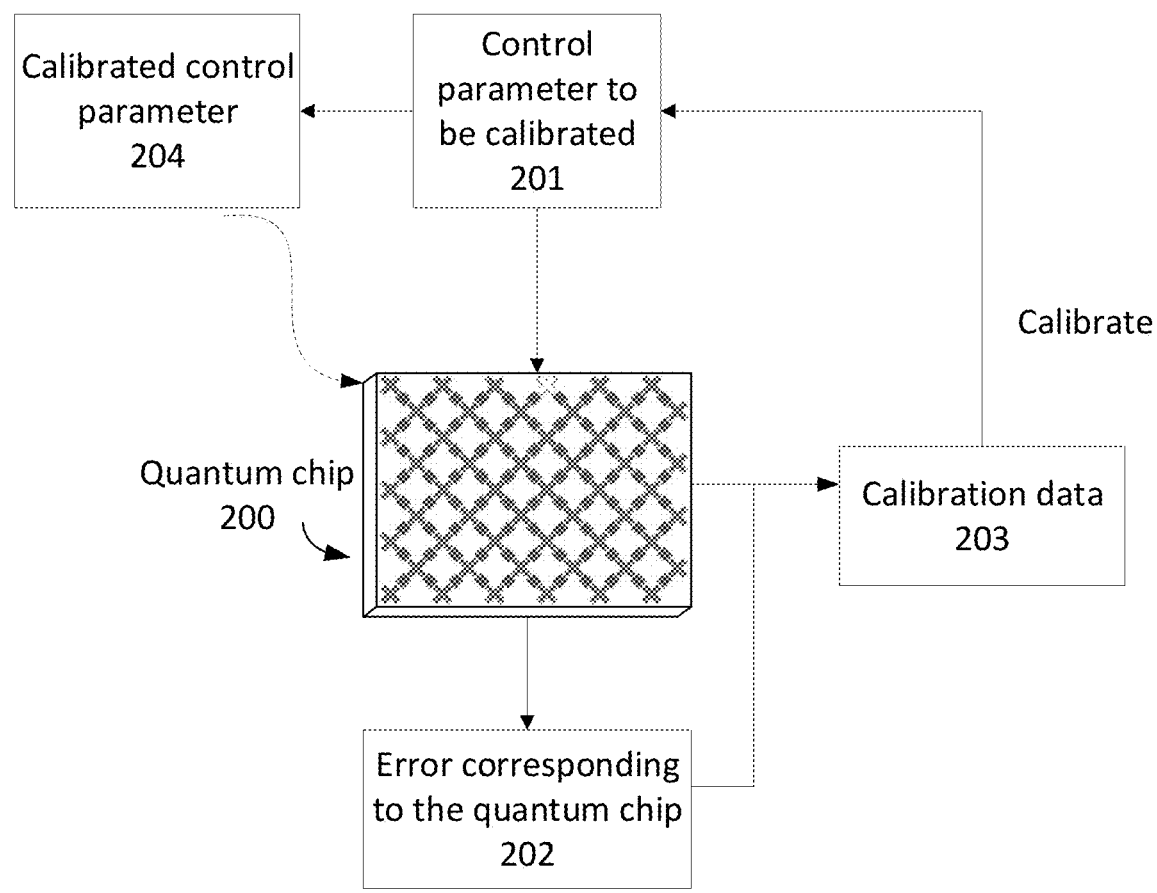
FIG. 2 is a schematic diagram illustrating principle of a parameter calibration method, according to some embodiment of the present disclosure.

FIG. 1 is a schematic flowchart illustrating an exemplary parameter calibration method 100, according to some embodiments of the present disclosure. FIG. 2 is a schematic diagram illustrating the principle of a parameter calibration method 100, according to some embodiments of the present disclosure. As shown in FIG. 1 and FIG. 2, a parameter calibration method 100 is provided. The parameter calibration method 100 can be executed by a parameter calibration apparatus. It can be understood that the parameter calibration apparatus can be implemented as software or a combination of software and hardware. Specifically, referring to FIG. 1 and FIG. 2, the parameter calibration method 100 can include the following steps S101-S104.

At step S101, a control parameter to be calibrated 201 is obtained.

The control parameter to be calibrated 201 is a parameter that can change with a chip parameter of the quantum chip 200. Specifically, the chip parameter of the quantum chip 200 can include at least one of: a capacitance corresponding to the quantum chip, an inductance corresponding to the quantum chip, or a parameter corresponding to the quantum chip and used for characterizing energy stored in a Josephson junction. In other words, after the structure of the quantum chip 200 changes, any one of the capacitance corresponding to the quantum chip 200, the inductance corresponding to the quantum chip 200, or the parameter used for characterizing energy stored in the Josephson junction is changed. Therefore, the control parameter to be calibrated 201 can change with the structure of the quantum chip 200.

Certainly, the control parameter to be calibrated 201 can also be a parameter that changes with noise (related to the environment in which the quantum chip is located) that is present during operation of the quantum chip 200. That is, when the noise present during operation of the quantum chip 200 changes, the control parameter to be calibrated 201 changes accordingly. In an example, the control parameter to be calibrated 201 can include a waveform (e.g., waveform amplitude, waveform type, etc.) used for controlling the quantum chip 200 to perform an operation. It can be understood that the control parameter to be calibrated 201 is not limited to the parameter types described above, and a person skilled in the art can also set the control parameter to be calibrated 201 including other parameters according to specific application scenarios or application requirements, which will not be repeated in detail herein.

In addition, the control parameter to be calibrated 201 can be a parameter inputted in advance or an optimized parameter. The manner for obtaining the control parameter to be calibrated 201 is not limited in this example. For example, the control parameter to be calibrated 201 can be stored in a preset area, and the control parameter to be calibrated can be obtained by accessing the preset area. Alternatively, the control parameter to be calibrated can be stored in a third device. In this example, the parameter calibration apparatus configured to implement the parameter calibration method is provided with a preset interface, and the parameter calibration apparatus can communicate with the third device (e.g., with wire or wirelessly) through the preset interface. Therefore, the parameter calibration apparatus can obtain the control parameter 201 to be calibrated from the third device. Alternatively, the parameter calibration apparatus configured to implement the parameter calibration method is provided with an interaction interface, and an operation to be executed can be inputted through the interaction interface, so that the control parameter to be calibrated can be generated or determined based on the operation to be executed. Therefore, the control parameter to be calibrated can be obtained by the parameter calibration apparatus stably.

Certainly, it can be understood that the control parameter to be calibrated 201 can also be obtained in other manners, as long as the stability and reliability of obtaining the control parameter to be calibrated can be ensured, which will not be described in detail herein.

At step S102, a simulation running error 202 corresponding to a quantum chip 200 is determined.

When a parameter is used to control the quantum chip 200 to perform a quantum operation, the operation result of the quantum chip 200 may have a certain error. To ensure the quality and efficiency of the operation of the quantum chip 200, the parameter can be calibrated based on a simulation running error 202. Specifically, the manner for determining the simulation running error 202 corresponding to the quantum chip is not limited in this example. For example, a simulation control parameter corresponding to the quantum chip 200 is preset, and control of the quantum chip is simulated based on the simulation control parameter, so that the simulation running error 202 corresponding to the quantum chip can be obtained. It can be understood that different simulation running errors can correspond to different simulation running parameters. When the quantum chip 200 is controlled based on a simulation running parameter, a simulation running error corresponding to the simulation running parameter can be obtained. Alternatively, a machine learning model for analyzing the simulation running error 202 of the quantum chip is pre-trained. Specifically, the structure of the quantum chip 200 is determined, and then the structure of the quantum chip 200 is analyzed using the machine learning model, so that the simulation running error 202 corresponding to the quantum chip can be determined.

Certainly, it can be understood that the simulation running error 202 corresponding to the quantum chip can also be determined in other manners, as long as the accuracy and reliability of determining the simulation running error corresponding to the quantum chip can be ensured, which will not be described in detail herein.

At step S103, calibration data 203 corresponding to the control parameter is determined based on the simulation running error 202.

There is a mapping relationship between the simulation running error 202 corresponding to the quantum chip 200 and the calibration data 203. Therefore, after the simulation running error 202 corresponding to the quantum chip 200 is obtained, the calibration data 203 corresponding to the control parameter can be determined based on the simulation running error 202. The calibration data 203 is used for calibrating the control parameter to be calibrated 201, so as to improve the precision of controlling the quantum chip based on the control parameter.

At step S104, a calibrated control parameter 204 can be obtained by calibrating the control parameter to be calibrated 201 based on the calibration data 203. The calibrated control parameter 204 is used for controlling operation of the quantum chip 200.

After the calibration data 203 is obtained, the control parameter to be calibrated 201 can be calibrated based on the calibration data 203, to obtain a calibrated control parameter 204. The obtained calibrated control parameter 204 is used for controlling the operation of the quantum chip 200. In this way, the precision of controlling the quantum chip can be effectively improved. It can be understood that a larger deviation between the calibration data 203 and the control parameter to be calibrated 201 indicates a higher degree of calibrating the control parameter to be calibrated 201 based on the calibration data 203; a smaller deviation between the calibration data 203 and the control parameter to be calibrated 201 indicates a lower degree of calibrating the control parameter to be calibrated 201 based on the calibration data 203. When the calibration data 203 is the same as the control parameter to be calibrated 201, there is no need to calibrate the control parameter to be calibrated 201.

In the parameter calibration method provided in this example, by obtaining a control parameter to be calibrated and determining a simulation running error corresponding to a quantum chip, the calibration data corresponding to the control parameter is determined based on the simulation running error, and the control parameter to be calibrated is calibrated based on the calibration data. Therefore, the control parameter to be calibrated can be calibrated based on the simulation running error existed in the quantum chip, and the quantum chip can be controlled based on the calibrated control parameter, thereby ensuring the precision of the control of the quantum chip, and further improving the practicability of the parameter calibration method.

Figure 3:
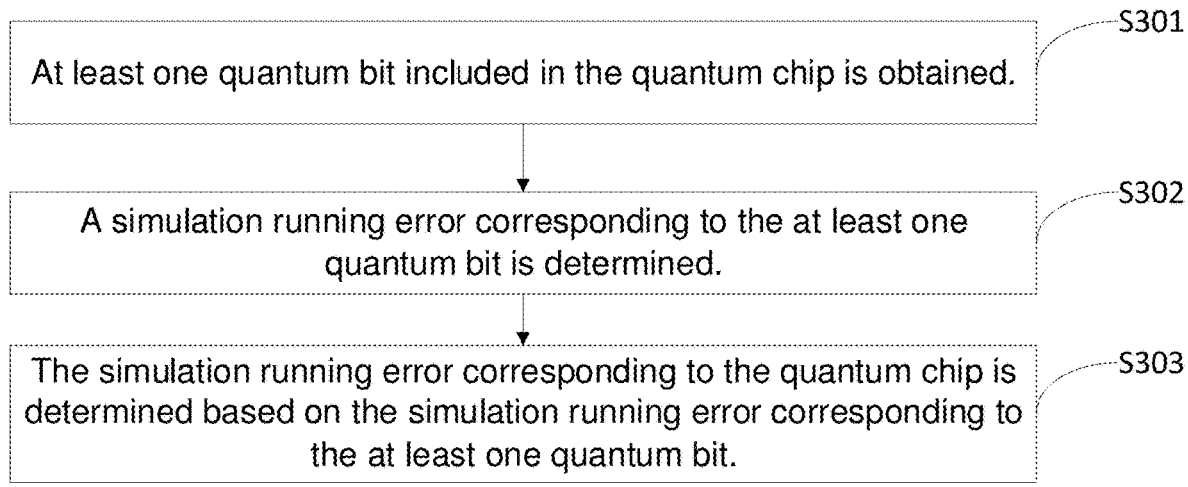
FIG. 3 is a schematic flowchart of determining a simulation running error corresponding to a quantum chip, according to some embodiment of the present disclosure.

FIG. 3 is a schematic flowchart illustrating sub-steps of S102 that determining a simulation running error corresponding to a quantum chip, according to some embodiments of the present disclosure. On the basis of the foregoing embodiments, referring to FIG. 3, an implementation of determining the simulation running error corresponding to the quantum chip is provided. Specifically, determining a simulation running error corresponding to a quantum chip can further include steps S301 to S303.

At step S301, at least one quantum bit included in the quantum chip is obtained.

At step S302, a simulation running error corresponding to the at least one quantum bit is determined.

At step S303, the simulation running error corresponding to the quantum chip is determined based on the simulation running error corresponding to the at least one quantum bit.

A quantum chip includes multiple structures such as at least one capacitor, at least one inductor, at least one quantum bit, and at least one quantum gate acting on one or two quantum bits. A main factor that influences the running error of the quantum chip is the quantum bit(s) arranged on the quantum chip. Therefore, to ensure the quality and efficiency of determining the simulation running error corresponding to the quantum chip, at least one quantum bit included in the quantum chip can be obtained. The at least one quantum bit is part of the quantum chips. A simulation running error corresponding to the at least one quantum bit can be determined by analyzing the at least one quantum bit. Then the simulation running error of the quantum chip is determined based on the simulation running error corresponding to the at least one quantum bit.

In some embodiments, the determining a simulation running error corresponding to the at least one quantum bit can include: determining a simulated performance parameter and a theoretical performance parameter corresponding to each of the at least one quantum bit; and determining the simulation running error corresponding to the at least one quantum bit based on the simulated performance parameter and the theoretical performance parameter.

Specifically, the determining a simulated performance parameter corresponding to each of the at least one quantum bit can include: obtaining at least one simulation running parameter used for controlling at least one quantum bit on the quantum chip; determining a quantum gate precision corresponding to each of the at least one simulation running parameter; and determining the simulated performance parameter corresponding to each of the at least one quantum bit based on the quantum gate precision corresponding to each of the at least one simulation running parameter.

In order to accurately obtain the simulation running error corresponding to the at least one quantum bit, at least one simulation running parameter (e.g., including a waveform used for controlling the quantum chip to perform operations) used for controlling the at least one quantum bit on the quantum chip can be obtained, and then the at least one quantum bit on the quantum chip can be controlled to simulate operation based on the at least one simulation running parameter, so as to obtain the simulated performance parameter corresponding to the at least one quantum bit. Specifically, a quantum gate precision corresponding to each of the at least one simulation running parameter is determined, and then the simulated performance parameter corresponding to each of the at least one quantum bit can be determined by analyzing the quantum gate precision corresponding to each of the at least one simulation running parameter. In some embodiments, the quantum gate precision is correlated to a performance parameter of the quantum bit, for example, a higher quantum gate precision indicates a higher performance parameter of the quantum bit, and a lower quantum gate precision indicates a lower performance parameter of the quantum bit. Therefore, after the quantum gate precision corresponding to each of the at least one simulation running parameter is obtained, the quantum gate precision corresponding to each of the at least one simulation running parameter can be determined as the simulated performance parameter corresponding to each of the at least one quantum bit.

When the simulation running parameter is used to control the quantum bit, the simulated performance parameter can correspond to a theoretical performance parameter. Therefore, after the quantum chip is controlled to simulate operation based on a preset parameter, the theoretical performance parameter corresponding to the simulated performance parameter can be directly obtained according to the simulation running parameter.

After the simulated performance parameter and the theoretical performance parameter are obtained, the simulated performance parameter and the theoretical performance parameter can be analyzed to determine the simulation running error corresponding to the at least one quantum bit. It can be understood that simulation running errors corresponding to different simulation running parameters can be the same or different, for example, when different simulation running parameters are used to control the same quantum bit to operate, a same simulation running error or different simulation running errors can be obtained. When the same simulation running parameter is used to control different quantum bits to operate, the same simulation running error or different simulation running errors can be obtained.

In addition, the at least one simulation running parameter used for controlling the at least one quantum bit can include a chip parameter and a control parameter. Specifically, the chip parameter includes at least one of: a capacitance corresponding to the quantum chip, an inductance corresponding to the quantum chip, or a parameter corresponding to the quantum chip and used for characterizing energy stored in a Josephson junction. Therefore, the obtained simulation running error can include at least one of: a simulation running error corresponding to a chip parameter or a simulation running error corresponding to the control parameter.

After the simulation running error corresponding to the at least one quantum bit is obtained, the simulation running error corresponding to the at least one quantum bit can be analyzed to determine the simulation running error corresponding to the quantum chip. In some embodiments, the simulation running error corresponding to the at least one quantum bit can be directly determined as the simulation running error corresponding to the quantum chip.

For example, the quantum chip includes fifty quantum bits. In order to accurately determine the simulation running error corresponding to the quantum chip, one quantum bit included in the quantum chip can be obtained, then the one quantum bit can be analyzed to determine a simulation running error corresponding to the one quantum bit, and then the simulation running error corresponding to the one quantum bit can be determined as the simulation running error corresponding to the quantum chip.

Alternatively, if the quantum chip includes eighty quantum bits, two quantum bits included in the quantum chip can be obtained, then the two quantum bits can be analyzed to determine simulation running errors corresponding to the two quantum bits. The simulation running errors corresponding to the two quantum bits can be determined as the simulation running error corresponding to the quantum chip. In this way, the quality and efficiency of determining the simulation running error corresponding to the quantum chip are effectively ensured, and the flexibility and reliability of determining the simulation running error corresponding to the quantum chip is also ensured.

In this example, by obtaining at least one quantum bit included in the quantum chip, and determining a simulation running error corresponding to the at least one quantum bit, a simulation running error corresponding to the quantum chip is determined based on the simulation running error corresponding to the at least one quantum bit. Because the at least one quantum bit is part of the quantum chip, the data processing amount is effectively reduced, and the quality and efficiency of determining the simulation running error corresponding to the quantum chip are also effectively ensured, thereby further improving the stability and reliability of the calibration of the control parameter based on the simulation running error corresponding to the quantum chip.

Figure 4:
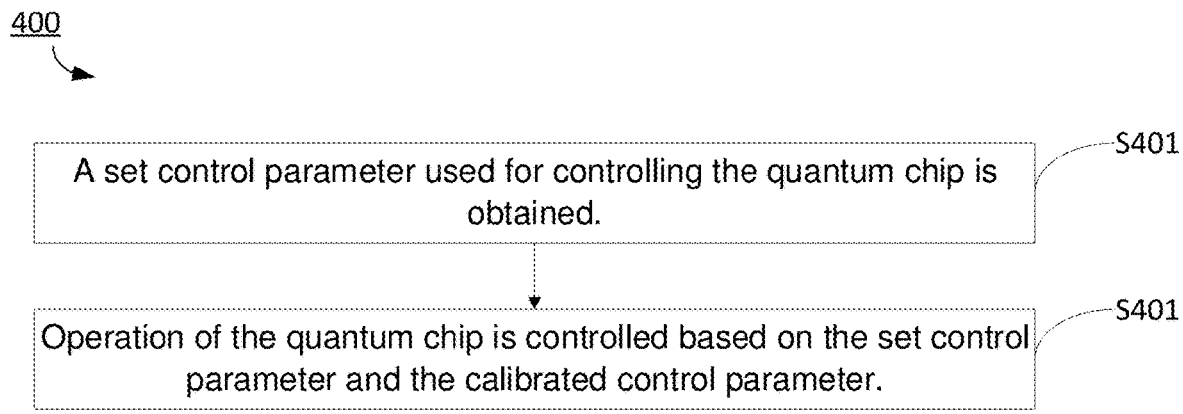
FIG. 4 is a schematic flowchart of another exemplary parameter calibration method, according to some embodiment of the present disclosure.

FIG. 4 is a schematic flowchart illustrating another parameter calibration method 400, according to some embodiments of the present disclosure. On the basis of any one of the foregoing embodiments, referring to FIG. 4, after the obtaining the calibrated control parameter, the method 400 can further include the following steps S401 and S402.

At step S401, a set control parameter used for controlling the quantum chip is obtained. The set control parameter does not change with the chip parameter of the quantum chip.

At step S402, operation of the quantum chip is controlled based on the set control parameter and the calibrated control parameter.

The parameters for controlling the quantum chip not only include the control parameter to be calibrated that changes with the chip parameter of the quantum chip, but also include the set control parameter that does not change with the chip parameter of the quantum chip. Therefore, in order to accurately ensure the stability and reliability of the control of the quantum chip, the set control parameter used for controlling the quantum chip can be obtained. Specifically, a specific implementation of obtaining the set control parameter used for controlling the quantum chip in this example is similar to the specific implementation of obtaining the control parameter to be calibrated in the foregoing embodiments. Reference can be made to the foregoing descriptions for details, which will not be repeated herein.

After the set control parameter and the calibrated control parameter are obtained, operation of the quantum chip can be controlled based on the set control parameter and the calibrated control parameter, thereby realizing quantum operations, ensuring the accuracy of the quantum operation result, and further improving the practicality of parameter calibration method.

Figure 5:
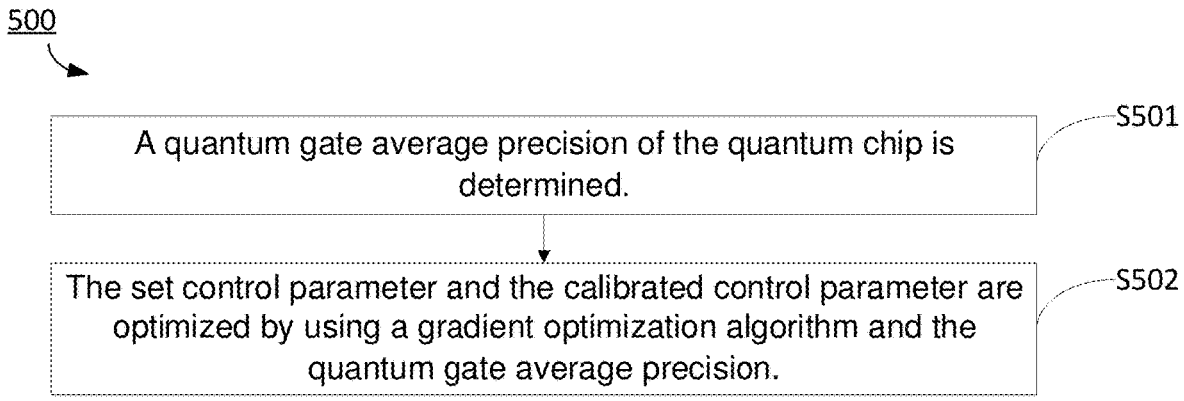
FIG. 5 is a schematic flowchart of another exemplary parameter calibration method, according to some embodiment of the present disclosure.

FIG. 5 is a schematic flowchart of still another parameter calibration method 500, according to some embodiments of the present disclosure. On the basis of any one of the foregoing embodiments, referring to FIG. 5, after the controlling operation of the quantum chip based on the set control parameter and the calibrated control parameter, the method 500 can further include the following steps S501 and S502.

At step S501, a quantum gate average precision of the quantum chip is determined.

The determining a quantum gate average precision of the quantum chip can include: obtaining at least one set error parameter used for controlling at least one quantum bit on the quantum chip; determining a quantum gate precision corresponding to each of the at least one set error parameter; and averaging all the quantum gate precisions corresponding to the at least one set error parameter to obtain a quantum gate average precision.

Specifically, the quantum chip includes structures such as a capacitor, an inductor, at least one quantum bit, and a quantum gate acting on one or two quantum bits. To improve the efficiency of determining the quantum gate average precision of the quantum chip and reduce the amount of data to be analyzed, at least one set error parameter used for controlling at least one quantum bit on the quantum chip can be obtained. After the at least one set error parameter is obtained, the quantum chip can be controlled to perform a simulation operation based on the at least one set error parameter, the set control parameter, and the control parameter to be calibrated. It can be understood that one set error parameter can correspond to one simulation operation, and different set error parameters can correspond to different simulation operations. The quantum gate precision corresponding to each of the at least one set error parameter can be obtained.

After all the quantum gate precisions corresponding to the at least one set error parameter are obtained, all the quantum gate precisions corresponding to the at least one set error parameter can be averaged to obtain the quantum gate average precision, thereby effectively ensuring the accuracy and reliability of determining the quantum gate average precision.

At step S502, the set control parameter and the calibrated control parameter are optimized by using a gradient optimization algorithm and the quantum gate average precision.

After the quantum gate average precision is obtained, the set control parameter and the calibrated control parameter can be optimized by using the gradient optimization algorithm and the quantum gate average precision. Specifically, optimizing the set control parameter and the calibrated control parameter by using a gradient optimization algorithm and the quantum gate average precision can further include: performing a reverse differentiation operation on the quantum gate average precision by using the gradient optimization algorithm to obtain a gradient of the set control parameter and a gradient of the calibrated control parameter; and optimizing the set control parameter and the calibrated control parameter respectively based on the gradient of the set control parameter and the gradient of the calibrated control parameter, to obtain a first optimized parameter and a second optimized parameter. The first optimized parameter and the second optimized parameter are used for controlling the quantum chip.

Specifically, a reverse differentiation operation can be performed on the quantum gate average precision using an automatic gradient optimization framework. The automatic gradient optimization framework is a pre-trained software framework that can automatically calculate gradients and use the gradient information for optimization. By performing the reverse differential operation on the quantum gate average precision using the automatic gradient optimization framework, the quality and efficiency of the reverse differential operation can be effectively ensured, so that the gradient of the set control parameter (e.g., a first-order derivative of the set control parameter) and the gradient of the calibrated control parameter (e.g., a first-order derivative of the calibrated control parameter) can be stably obtained. The gradient of the set control parameter is used for optimizing the set control parameter. The gradient of the calibrated control parameter is used for optimizing the calibrated control parameter. After the optimization, a first optimized parameter and a second optimized parameter can be obtained. The quantum chip can be controlled based on the first optimized parameter and the second optimized parameter, thereby improving the quality and efficiency of operation of the quantum chip.

In this example, by determining the quantum gate average precision of the quantum chip and then optimizing the set control parameter and the calibrated control parameter by using the gradient optimization algorithm and the quantum gate average precision, the gradient of the set control parameter and the gradient of the calibrated control parameter can be obtained at the same time. The set control parameter and the calibrated control parameter can be optimized respectively based on the gradient of the set control parameter and the gradient of the calibrated control parameter. Therefore, efficient parameter optimization is effectively achieved. In addition, the quantum chip can be controlled based on the first optimized parameter and the second optimized parameter that are obtained. In this way, the precision of control of the quantum chip are effectively ensured, and the practicability of the parameter calibration method is further improved.

Figure 6:
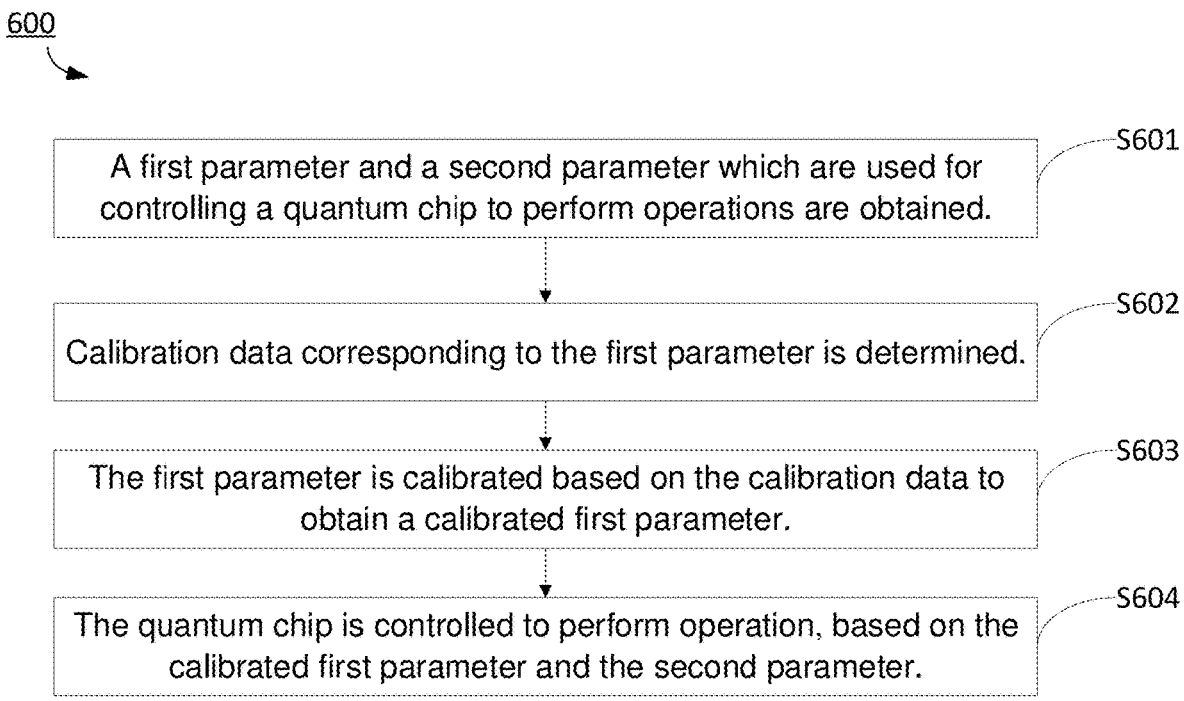
FIG. 6 is a schematic flowchart of an exemplary quantum chip control method, according to some embodiment of the present disclosure.

FIG. 6 is a schematic flowchart of a quantum chip control method 600, according to some embodiments of the present disclosure. Referring to FIG. 6, a quantum chip control method 600 is provided. The quantum chip control method 600 can be executed by a quantum chip control apparatus. It can be understood that the quantum chip control apparatus can be implemented as software or a combination of software and hardware. Specifically, the quantum chip control method can include the following steps S601 to S604.

At step S601, a first parameter and a second parameter which are used for controlling a quantum chip to perform operations are obtained. The first parameter changes with a chip parameter of the quantum chip, and the second parameter does not change with the chip parameter of the quantum chip.

The first parameter (or referred to as the chip parameter) can be a parameter that cannot be changed during operation of the quantum chip. The chip parameter is correlated to the structure of the chip. For example, the chip parameter can include at least one of: a capacitance corresponding to the quantum chip, an inductance corresponding to the quantum chip, or a parameter corresponding to the quantum chip and used for characterizing energy stored in a Josephson junction. The second parameter (or referred to as the control parameter) can be a parameter that can be changed during operation of the quantum chip. For example, the control parameter can include a waveform used for controlling the quantum chip to perform an operation.

In addition, to accurately control the quantum chip, the first parameter and the second parameter that are used for controlling the quantum chip can be obtained. The specific manner for obtaining the first parameter and the second parameter is not limited in the disclosure. For example, the first parameter and the second parameter can be stored in a preset area, and the first parameter and the second parameter can be obtained by accessing the preset area. Alternatively, the first parameter and the second parameter can be stored in a third device, and a preset interface is provided on the control apparatus that is configured to implement the quantum chip control method. The control apparatus can communicate with the third device through the preset interface. In this case, the control apparatus can obtain the first parameter and the second parameter from the third device. Alternatively, the control apparatus configured to implement the quantum chip control method is provided with an interaction interface, and a user inputs an operation to be executed through the interaction interface, so that the control apparatus generates the first parameter and the second parameter based on the operation to be executed. In this way, the control apparatus can stably obtain the first parameter and the second parameter. Certainly, it can be understood that the first parameter and the second parameter can also be obtained in other manners, as long as the stability and reliability of obtaining the first parameter and the second parameter can be ensured, and these other manners will not be described in detail herein.

At step S602, calibration data corresponding to the first parameter is determined. The calibration data is determined based on a simulation running error corresponding to the quantum chip.

Because the first parameter changes with the chip parameter of the quantum chip, the calibration data corresponding to the first parameter can be determined in order to ensure the stability and reliability of the control of the quantum chip based on the first parameter. The calibration data is determined based on the simulation running error corresponding to the quantum chip. Specifically, the implementation process and implementation effects of determining the calibration data corresponding to the first parameter in this example are similar to those of "determining calibration data corresponding to the control parameter based on the simulation running error" in the foregoing embodiments. Reference can be made to the foregoing descriptions for details, which will not be repeated here.

At step S603, the first parameter is calibrated based on the calibration data to obtain a calibrated first parameter.

At step S604, the quantum chip is controlled to perform operation, based on the calibrated first parameter and the second parameter.

After the calibration data is obtained, the first parameter can be calibrated based on the calibration data to obtain a calibrated first parameter, and then the quantum chip can be controlled to perform a quantum operation based on the calibrated first parameter and the second parameter, thereby further improving the quality and efficiency of quantum operations.

In the quantum chip control method provided in this example, by obtaining a first parameter and a second parameter which are used for controlling a quantum chip to perform operations, calibration data corresponding to the first parameter is determined. The first parameter is calibrated based on the calibration data to obtain a calibrated first parameter. The quantum chip is controlled to perform an operation based on the calibrated first parameter and the second parameter. Therefore, efficient parameter calibration is achieved. In addition, the quantum chip can be controlled based on the obtained calibrated first parameter and the second parameter, which effectively ensures the precision of control of the quantum chip, thereby further improving the practicability of the quantum chip control method.

Figure 7:
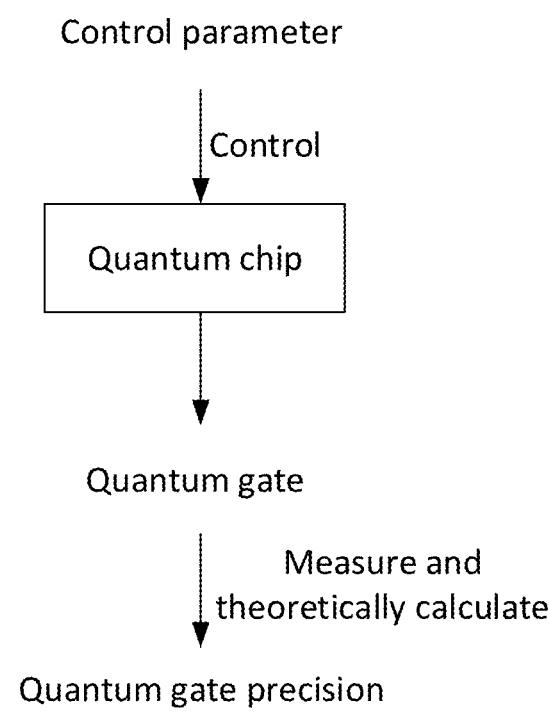
FIG. 7 is a schematic a diagram illustrating principle of a quantum chip control method, according to some embodiment of the present disclosure.
Figure 8A:
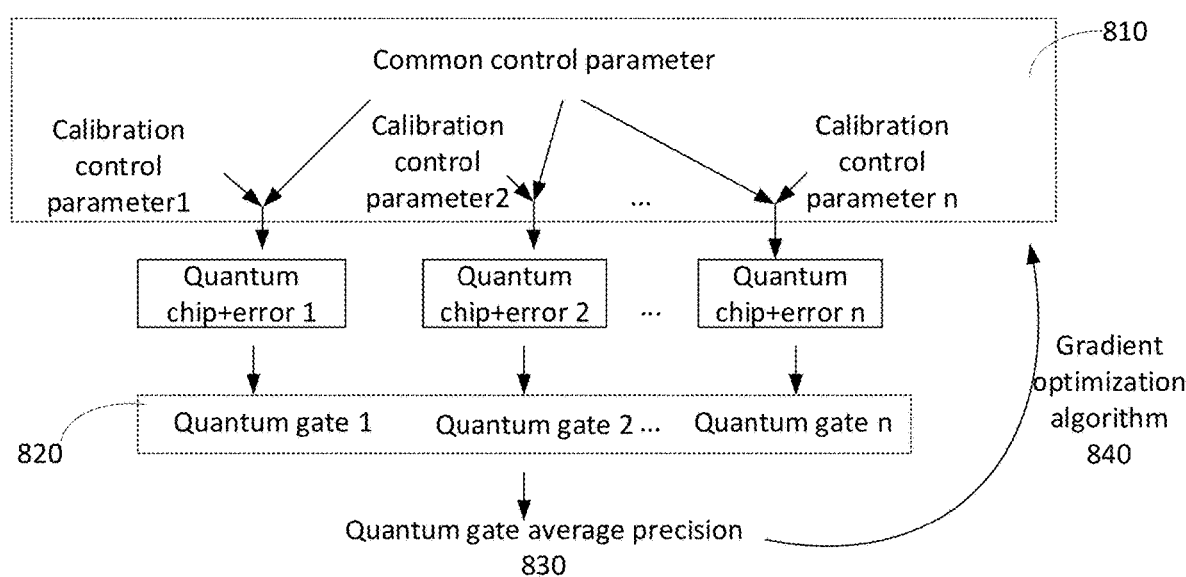
FIG. 8A is a schematic another diagram illustrating the principle of a quantum chip control method, according to some embodiment of the present disclosure.
Figure 8B:
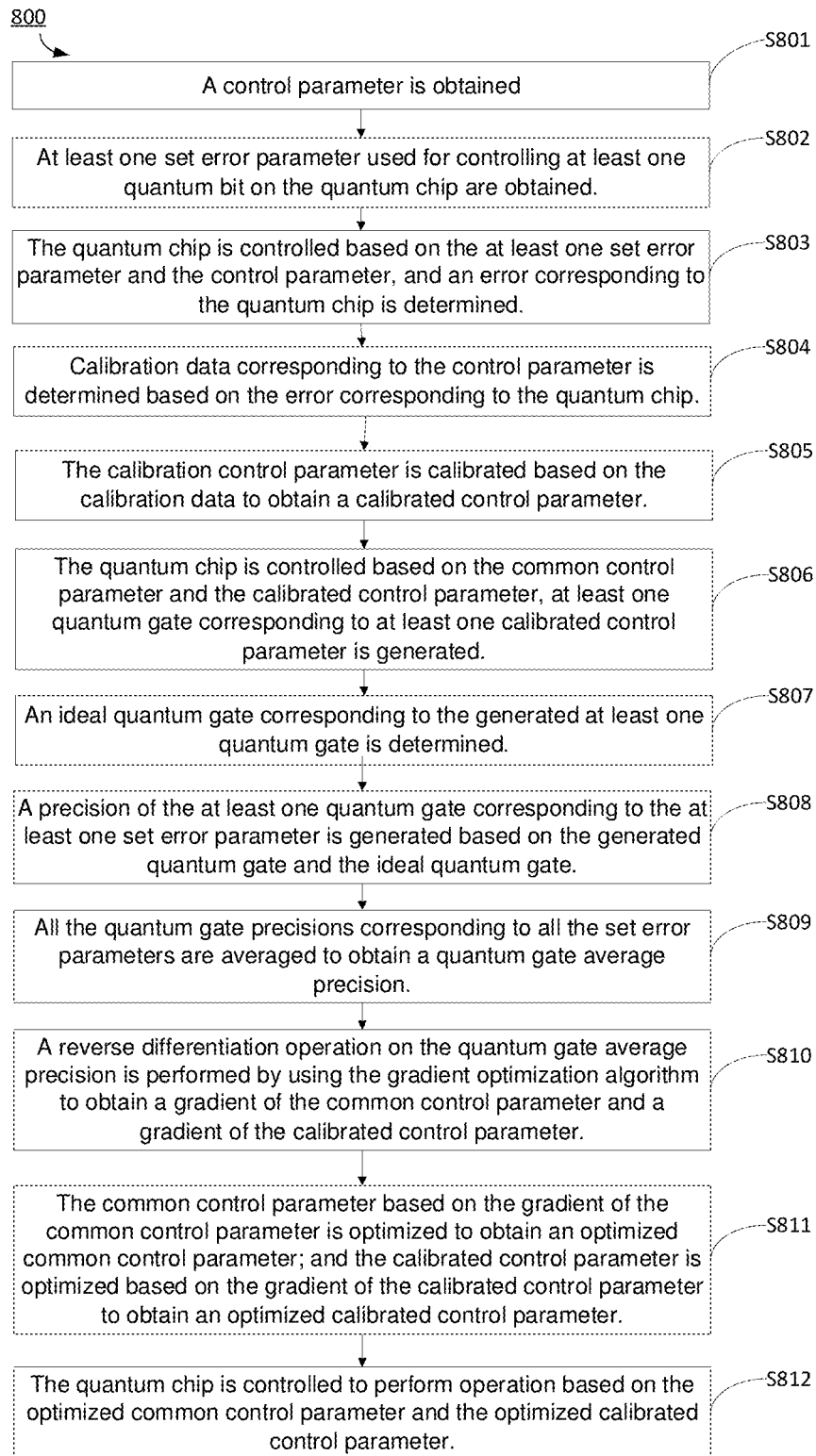
FIG. 8B is a schematic flowchart of an exemplary quantum chip control method with the principle shown in FIG. 8A, according to some embodiment of the present disclosure.

Referring to FIG. 7, FIG. 8A, and FIG. 8B, a quantum chip control method 800 is provided. The control method 800 includes a process of calibrating a parameter and a process of controlling the quantum chip and implementing parameter optimization based on the calibrated parameter. Specifically, the process of calibrating a parameter and the process of controlling the quantum chip and implementing parameter optimization based on the calibrated parameter can both be implemented by an automatic differentiation framework. To be specific, executable instructions for implementing the quantum chip control method can be written in the automatic differentiation framework by using a language tool specified in the automatic differentiation framework, so that the operations of calibrating and optimizing the relevant parameters of the quantum chip and controlling the quantum chip can be realized. Specifically, referring to FIG. 8A and FIG. 8B, the method 800 includes the following steps S801 to S812.

At step S801, a control parameter 810 is obtained.

The control parameter 810 includes a common control parameter and a calibration control parameter. The common control parameter can be a control parameter that does not change with a fluctuation of the chip parameters or noise of control. The calibration control parameter can be a control parameter that changes with a fluctuation of the chip parameters and noise of control. The common control parameter includes at least one of: a capacitance corresponding to the quantum chip, an inductance corresponding to the quantum chip, or a parameter corresponding to the quantum chip and used for characterizing energy stored in a Josephson junction. The calibration control parameter can include a waveform used for controlling the quantum chip.

At step S802, at least one set error parameter used for controlling at least one quantum bit on the quantum chip are obtained.

At step S803, the quantum chip is controlled based on the at least one set error parameter and the control parameter, and an error corresponding to the quantum chip is determined.

At step S804, calibration data corresponding to the control parameter (e.g., a common control parameter or a calibration control parameter) is determined based on the error corresponding to the quantum chip.

Each set error parameter can correspond to one error. Therefore, the quantity of calibration data determined based on the errors corresponding to the quantum chip is the same as the quantity of errors, i.e., each error corresponds to one calibration data.

At step S805, the calibration control parameter is calibrated based on the calibration data to obtain a calibrated control parameter.

The quantity of calibration data can be one or more, and the quantity of calibrated control parameters obtained is the same as the quantity of calibration data. For example, when the errors include error 1, error 2, . . . , error n, calibrated control parameters corresponding to the errors can be obtained. For example, the calibrated control parameters can include calibration control parameter 1, calibration control parameter 2, . . . , calibration control parameter n.

At step S806, the quantum chip is controlled based on the common control parameter and the calibrated control parameter, at least one quantum gate 820 corresponding to at least one calibrated control parameter is generated.

At step S807, an ideal quantum gate corresponding to the generated at least one quantum gate is determined. The ideal quantum gate can include theoretical performance parameters.

At step S808, a precision of the at least one quantum gate corresponding to the at least one set error parameter is generated based on the generated quantum gate and the ideal quantum gate.

At step S809, all the quantum gate precisions corresponding to all the set error parameters are averaged to obtain a quantum gate average precision 830.

At step S810, a reverse differentiation operation on the quantum gate average precision is performed by using the gradient optimization algorithm 840 to obtain a gradient of the common control parameter and a gradient of the calibrated control parameter.

At step S811, the common control parameter based on the gradient of the common control parameter is optimized to obtain an optimized common control parameter; and the calibrated control parameter is optimized based on the gradient of the calibrated control parameter to obtain an optimized calibrated control parameter.

At step S812, the quantum chip is controlled to perform operation based on the optimized common control parameter and the optimized calibrated control parameter.

In the quantum chip control method provided in this example, by obtaining a control parameter to be calibrated, an error corresponding to a quantum chip is determined. Calibration data corresponding to the control parameter is determined based on the error, and the control parameter is calibrated based on the calibration data. Thus, the control parameter can be calibrated based on the error existing in the quantum chip, and the quantum chip can be controlled based on the calibrated control parameter, thereby ensuring the precision of control of the quantum chip. In addition, the common control parameter and the calibrated control parameter can be optimized to obtain an optimized common control parameter and an optimized calibrated control parameter, and the quantum chip can be controlled based on the optimized common control parameter and the optimized calibrated control parameter, thereby further improving the practicality of the quantum chip control method.

Figure 9:
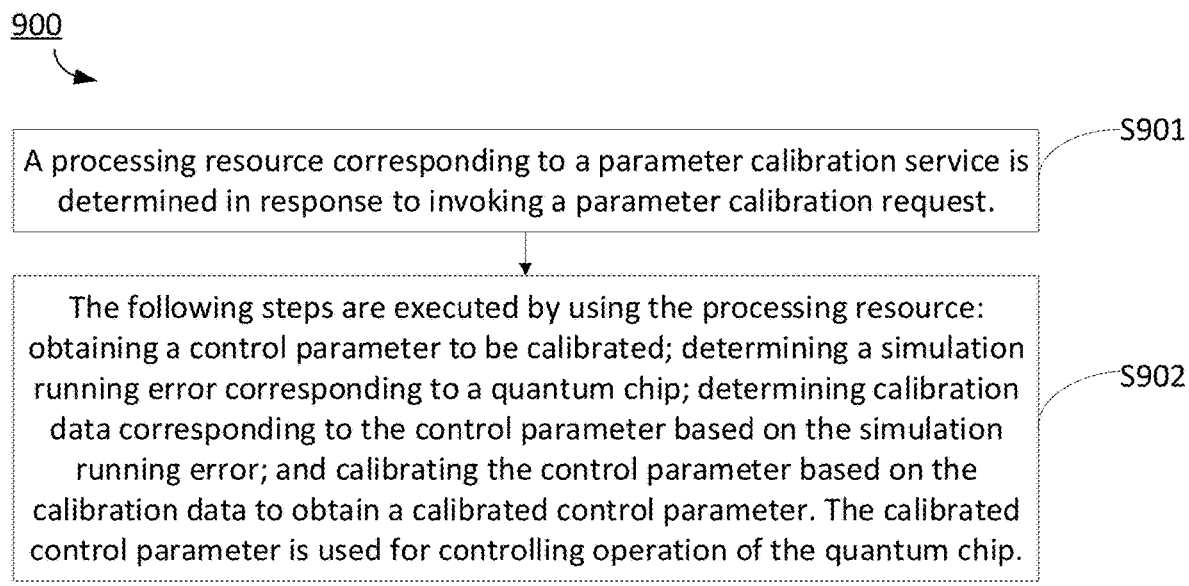
FIG. 9 is a schematic flowchart of another exemplary parameter calibration method, according to some embodiment of the present disclosure.

FIG. 9 is a schematic flowchart of another parameter calibration method 900, according to some embodiment of present disclosure. Referring to FIG. 9, a parameter calibration method 900 is provided. The method 900 can be executed by a parameter calibration apparatus. It can be understood that the parameter calibration apparatus can be implemented as software or a combination of software and hardware. Specifically, the parameter calibration method 900 can include the following steps S901 and S902.

At step S901, a processing resource corresponding to a parameter calibration service is determined in response to invoking a parameter calibration request.

At step S902, the following steps are executed by using the processing resource: obtaining a control parameter to be calibrated; determining a simulation running error corresponding to a quantum chip; determining calibration data corresponding to the control parameter based on the simulation running error; and calibrating the control parameter based on the calibration data to obtain a calibrated control parameter. The calibrated control parameter is used for controlling operation of the quantum chip.

Specifically, the parameter calibration method provided in the present disclosure can be executed in a cloud. For example, several computing nodes can be deployed in the cloud, and each computing node has processing resources such as computing and storage resources. In the cloud, multiple computing nodes can be organized to provide a certain service. Certainly, one computing node can provide one or more services.

For the solution provided in the present disclosure, the cloud can provide a service for implementing the parameter calibration method, which is referred to as a parameter calibration service. When a user needs to use the parameter calibration service, the parameter calibration service is invoked to trigger a request for invoking the parameter calibration service to the cloud. The cloud determines a computing node for responding to the request, and executes the following steps by using a processing resource in the computing node: obtaining a control parameter to be calibrated; determining a simulation running error corresponding to a quantum chip; determining calibration data corresponding to the control parameter based on the simulation running error; and calibrating the control parameter based on the calibration data to obtain a calibrated control parameter, where the calibrated control parameter is used for controlling operation of the quantum chip.

Specifically, the implementation process, implementation principle, and implementation effects of the steps in this example are similar to those of the steps in the embodiments shown in FIG. 1-FIG. 5 and FIG. 7-FIGS. 8A and 8B. For parts not described in detail in this example, reference can be made to the relevant descriptions of the embodiments shown in FIG. 1-FIG. 5 and FIG. 7-FIGS. 8A and 8B.

Figure 10:
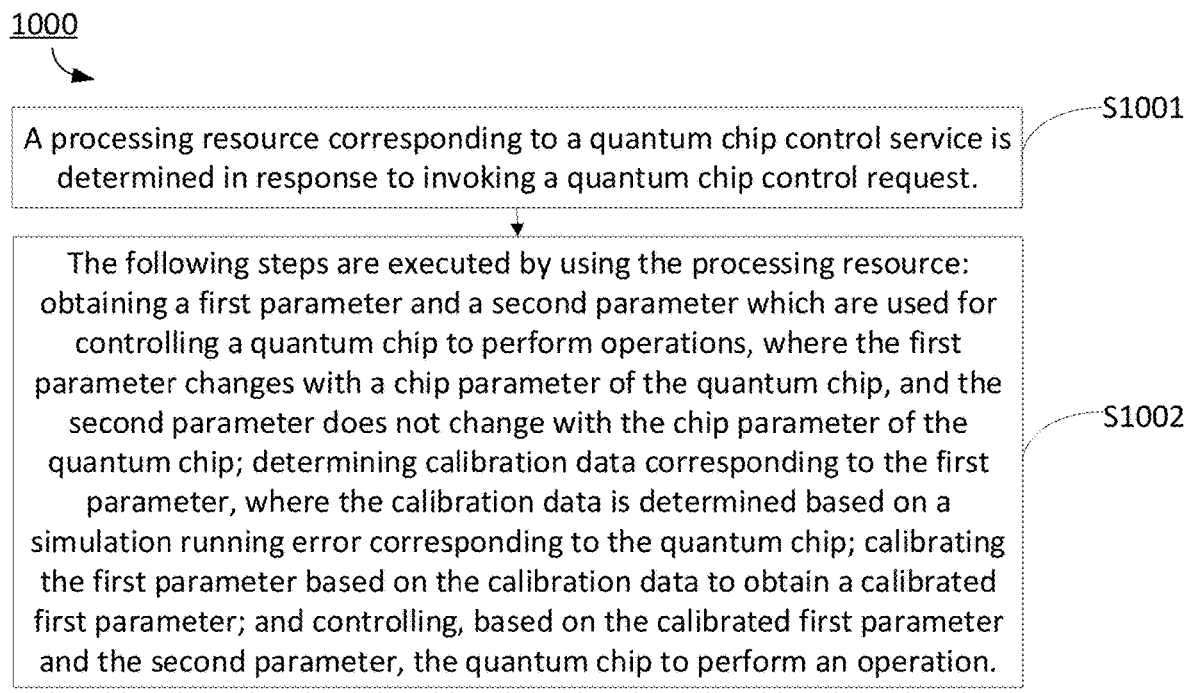
FIG. 10 is a schematic flowchart of another exemplary quantum chip control method, according to some embodiment of the present disclosure.

FIG. 10 is a schematic flowchart of another quantum chip control method 1000, according to some embodiments of the present disclosure. Referring to FIG. 10, a quantum chip control method 1000 is provided. The method 1000 can be executed by a quantum chip control apparatus. It can be understood that the quantum chip control apparatus can be implemented as software or a combination of software and hardware. Specifically, the quantum chip control method 1000 can include the following steps S1001 and S1002.

At step S1001, a processing resource corresponding to a quantum chip control service is determined in response to invoking a quantum chip control request.

At step S1002, the following steps are executed by using the processing resource: obtaining a first parameter and a second parameter which are used for controlling a quantum chip to perform operations, where the first parameter changes with a chip parameter of the quantum chip, and the second parameter does not change with the chip parameter of the quantum chip; determining calibration data corresponding to the first parameter, where the calibration data is determined based on a simulation running error corresponding to the quantum chip; calibrating the first parameter based on the calibration data to obtain a calibrated first parameter; and controlling, based on the calibrated first parameter and the second parameter, the quantum chip to perform an operation.

Specifically, the quantum chip control method provided in the present disclosure can be executed in a cloud. Several computing nodes can be deployed in the cloud, and each computing node has processing resources such as computing and storage resources. In the cloud, multiple computing nodes can be organized to provide a certain service. Certainly, one computing node can provide one or more services.

For the solution provided in the present disclosure, the cloud can provide a service for implementing the quantum chip control method, which is referred to as a quantum chip control service. When a user needs to use the quantum chip control service, the quantum chip control service is invoked to trigger a request for invoking the quantum chip control service to the cloud. The cloud determines a computing node for responding to the request, and executes the following steps by using a processing resource in the computing node: obtaining a first parameter and a second parameter which are used for controlling a quantum chip to perform operations, where the first parameter changes with a chip parameter of the quantum chip, and the second parameter does not change with the chip parameter of the quantum chip; determining calibration data corresponding to the first parameter, where the calibration data is determined based on a simulation running error corresponding to the quantum chip; calibrating the first parameter based on the calibration data to obtain a calibrated first parameter; and controlling, based on the calibrated first parameter and the second parameter, the quantum chip to perform an operation.

Specifically, the implementation process, implementation principle, and implementation effects of the steps in this example are similar to those of the steps in the embodiments shown in FIG. 6-FIGS. 8A and 8B. For parts not described in detail in this example, reference can be made to the relevant descriptions of the embodiments shown in FIG. 6-FIGS. 8A and 8B.

Figure 11:
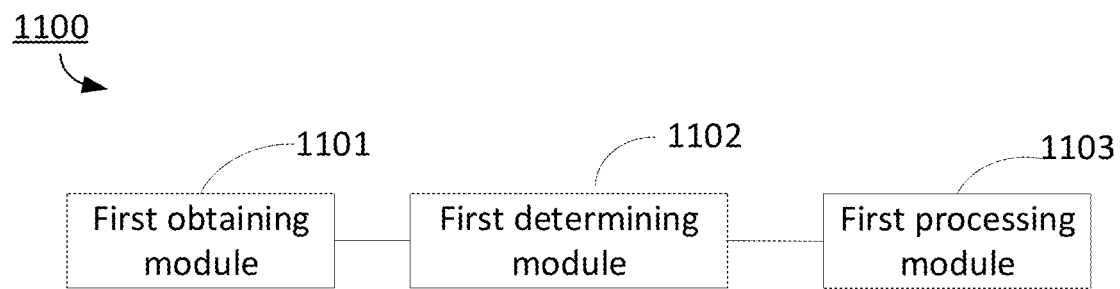
FIG. 11 is a schematic structural diagram of an exemplary parameter calibration apparatus, according to some embodiment of the present disclosure.

FIG. 11 is a schematic structural diagram of a parameter calibration apparatus, according to some embodiments of the present disclosure. Referring to FIG. 11, a parameter calibration apparatus 1100 is provided. The parameter calibration apparatus 1100 is configured to execute the parameter calibration method 100 shown in FIG. 1. Specifically, the parameter calibration apparatus can include: a first obtaining module 1101, a first determining module 1102, and a first processing module 1103.

The first obtaining module 1101 is configured to obtain a control parameter to be calibrated.

The first determining module 1102 is configured to determine a simulation running error corresponding to a quantum chip; and further configured to determine calibration data corresponding to the control parameter based on the simulation running error.

The first processing module 1103 is configured to calibrate the control parameter based on the calibration data to obtain a calibrated control parameter. The calibrated control parameter is used for controlling operation of the quantum chip.

In some embodiments, the control parameter to be calibrated changes with a chip parameter of the quantum chip.

In some embodiments, when the first determining module 1102 determines the simulation running error corresponding to the quantum chip, the first determining module 1102 is configured to execute: obtaining at least one quantum bit included in the quantum chip; determining a simulation running error corresponding to the at least one quantum bit; and determining the simulation running error corresponding to the quantum chip based on the simulation running error corresponding to the at least one quantum bit.

In some embodiments, when the first determining module 1102 determines the simulation running error corresponding to the at least one quantum bit, the first determining module 1102 is configured to execute: determining a simulated performance parameter and a theoretical performance parameter corresponding to each of the at least one quantum bit; and determining the simulation running error corresponding to the at least one quantum bit based on the simulated performance parameter and the theoretical performance parameter.

In some embodiments, when the first determining module 1102 determines the simulated performance parameter corresponding to the at least one quantum bit, the first determining module 1102 is configured to execute: obtaining at least one simulation running parameter used for controlling at least one quantum bit on the quantum chip; determining a quantum gate precision corresponding to each of the at least one simulation running parameter; and determining the simulated performance parameter corresponding to each of the at least one quantum bit based on the quantum gate precision corresponding to each of the at least one simulation running parameter.

In some embodiments, different simulation running parameters correspond to a same simulation running error or different simulation running errors.

In some embodiments, the simulation running error includes at least one of: a simulation running error corresponding to a chip parameter or a simulation running error corresponding to the control parameter.

In some embodiments, the chip parameter includes at least one of: a capacitance corresponding to the quantum chip, an inductance corresponding to the quantum chip, or a parameter corresponding to the quantum chip and used for characterizing energy stored in a Josephson junction.

In some embodiments, after obtaining the calibrated control parameter, the first obtaining module 1101 is further configured to obtain a set control parameter used for controlling the quantum chip. The set control parameter does not change with the chip parameter of the quantum chip. The first processing module 1103 is further configured to control operation of the quantum chip based on the set control parameter and the calibrated control parameter.

In some embodiments, after controlling the operation of the quantum chip based on the set control parameter and the calibrated control parameter, the first determining module 1102 is further configured to determine a quantum gate average precision of the quantum chip. The first processing module 13 is further configured to optimize the set control parameter and the calibrated control parameter by using a gradient optimization algorithm and the quantum gate average precision.

In some embodiments, when the first determining module 1102 determines the quantum gate average precision of the quantum chip, the first determining module 1102 is configured to execute the following steps: obtaining at least one set error parameter used for controlling at least one quantum bit on the quantum chip; determining a quantum gate precision corresponding to each of the at least one set error parameter; and averaging all the quantum gate precisions corresponding to the at least one set error parameter to obtain the quantum gate average precision.

In some embodiments, when the first processing module 1103 optimizes the set control parameter and the calibrated control parameter by using the gradient optimization algorithm and the quantum gate average precision, the first processing module 1103 is configured to execute the following steps: performing a reverse differentiation operation on the quantum gate average precision by using the gradient optimization algorithm to obtain a gradient of the set control parameter and a gradient of the calibrated control parameter; and optimizing the set control parameter and the calibrated control parameter respectively based on the gradient of the set control parameter and the gradient of the calibrated control parameter, to obtain a first optimized parameter and a second optimized parameter, where the first optimized parameter and the second optimized parameter are used for controlling the quantum chip.

The apparatus shown in FIG. 11 can execute the method of the embodiments shown in FIG. 1-FIG. 5 and FIG. 7-FIGS. 8A and 8B. For parts not described in detail in this example, reference can be made to the relevant descriptions of the embodiments shown in FIG. 1-FIG. 5 and FIG. 7-FIGS. 8A and 8B. For the execution process and technical effects of this technical solution, reference can be made to the descriptions in the embodiments shown in FIG. 1-FIG. 5 and FIG. 7-FIGS. 8A and 8B, and the details will not be repeated here.

Figure 12:
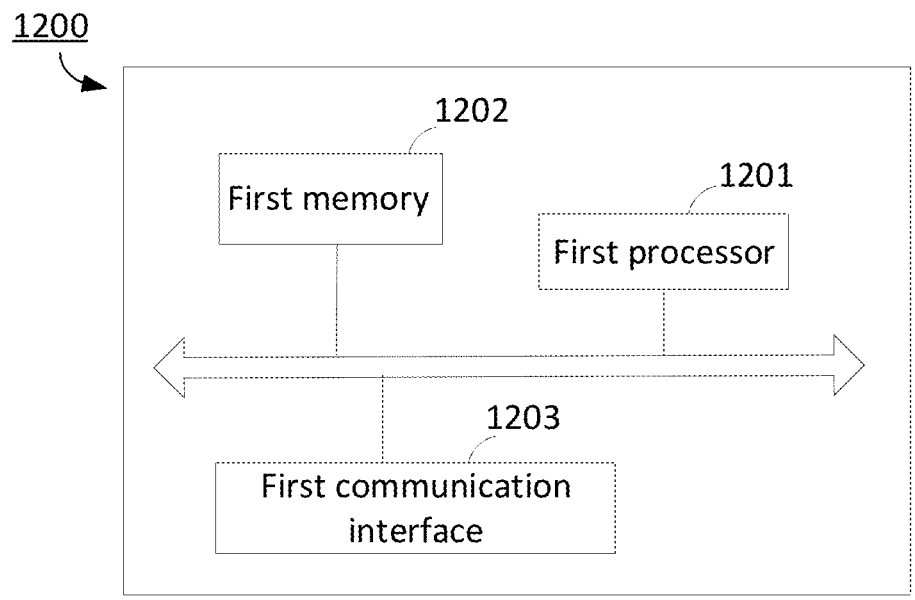
FIG. 12 is a schematic structural diagram of an exemplary electronic device corresponding to the parameter calibration apparatus shown in FIG. 11.

In a possible design, the structure of the parameter calibration apparatus shown in FIG. 11 can be implemented as an electronic device. The electronic device can be various devices such as a mobile phone, a tablet computer, a server, etc. As shown in FIG. 12, the electronic device 1200 can include: a first processor 1201 and a first memory 1202. The first memory 1202 is configured to store a program for causing the electronic device to execute the parameter calibration methods provided in the embodiments shown in FIG. 1-FIG. 5 and FIG. 7-FIGS. 8A and 8B. The first processor 1201 is configured to execute the program stored in the first memory 1202.

The program includes one or more computer instructions. The one or more computer instructions, when executed by the first processor 1201, can implement the following steps: obtaining a control parameter to be calibrated; determining a simulation running error corresponding to a quantum chip; determining calibration data corresponding to the control parameter based on the simulation running error; and calibrating the control parameter based on the calibration data to obtain a calibrated control parameter, where the calibrated control parameter is used for controlling operation of the quantum chip.

Further, the first processor 1201 is further configured to execute all or part of the steps in the foregoing embodiments shown in FIG. 1-FIG. 5 and FIG. 7-FIGS. 8A and 8B.

The structure of the electronic device can further include a first communication interface 1203, configured to enable the electronic device to communicate with another device or a communication network.

In addition, the embodiments of the present disclosure provide a computer storage medium, configured to store computer software instructions for use by an electronic device, which include a program for executing the parameter calibration method in the method embodiments shown in FIG. 1-FIG. 5 and FIG. 7-FIGS. 8A and 8B.

Figure 13:
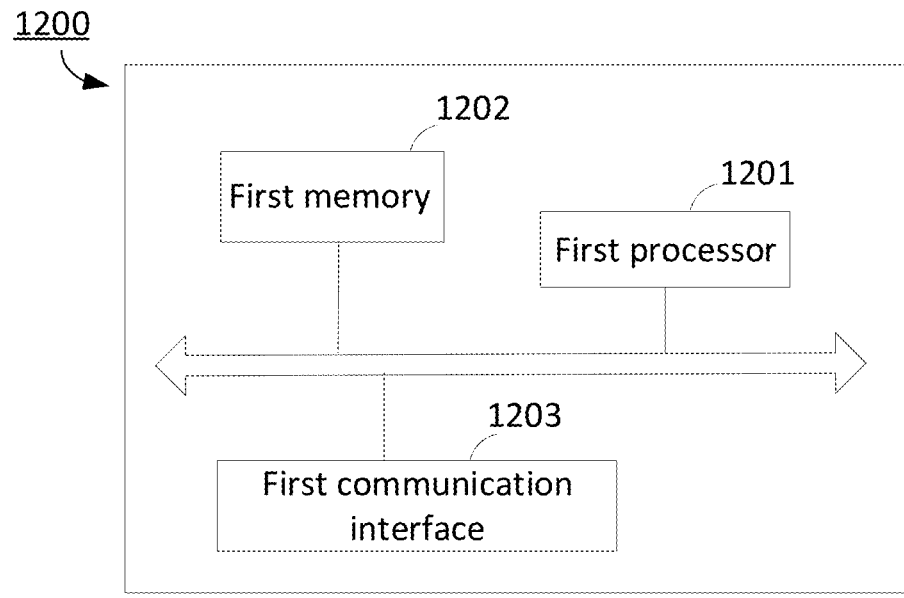
FIG. 13 is a schematic structural diagram of an exemplary quantum chip control apparatus, according to some embodiment of the present disclosure.

FIG. 13 is a schematic structural diagram of a quantum chip control apparatus 1300 according to some embodiments of the present disclosure. Referring to FIG. 13, a quantum chip control apparatus 1300 is provided. The quantum chip control apparatus 1300 is configured to execute the quantum chip control method 600 shown in FIG. 6. The quantum chip control apparatus 1300 can include: a second obtaining module 1301, a second determining module 1302, and a second processing module 1303. Specifically, the second obtaining module 1301 is configured to obtain a first parameter and a second parameter which are used for controlling a quantum chip to perform operations. The first parameter changes with a chip parameter of the quantum chip, and the second parameter does not change with the chip parameter of the quantum chip.

The second determining module 1302 is configured to determine calibration data corresponding to the first parameter. The calibration data is determined based on a simulation running error corresponding to the quantum chip.

The second processing module 1303 is configured to calibrate the first parameter based on the calibration data to obtain a calibrated first parameter; and further configured to control, based on the calibrated first parameter and the second parameter, the quantum chip to perform an operation.

The apparatus shown in FIG. 13 can execute the methods shown in FIG. 6-FIGS. 8A and 8B. For parts not described in detail in this example, reference can be made to the relevant descriptions of the embodiments shown in FIG. 6-FIGS. 8A and 8B. For the execution process and technical effects of this technical solution, reference can be made to the descriptions in the embodiments shown in FIG. 6-FIGS. 8A and 8B, and the details will not be repeated here.

Figure 14:
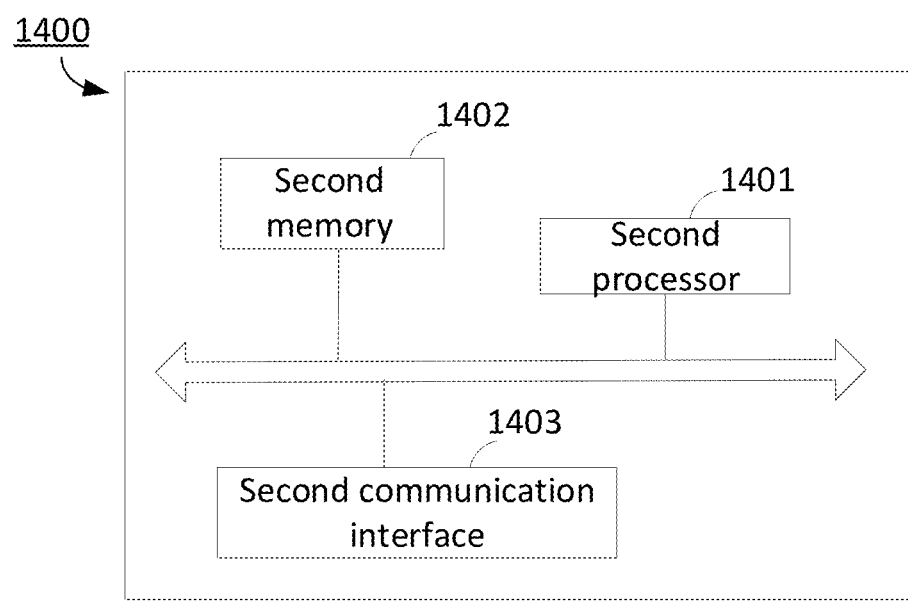
FIG. 14 is a schematic structural diagram of an electronic device corresponding to the quantum chip control apparatus shown in FIG. 13.

In a possible design, the structure of the quantum chip control apparatus shown in FIG. 13 can be implemented as an electronic device. The electronic device can be various devices such as a mobile phone, a tablet computer, a server, etc. As shown in FIG. 14, the electronic device 1400 can include: a second processor 1401 and a second memory 1402. The second memory 1402 is configured to store a program for causing the electronic device to execute the quantum chip control method provided in the embodiments shown in FIG. 6-FIGS. 8A and 8B. The second processor 1401 is configured to execute the program stored in the second memory 1402.

The program includes one or more computer instructions. The one or more computer instructions, when executed by the second processor 1401, can implement the following steps: obtaining a first parameter and a second parameter which are used for controlling a quantum chip to perform operations, where the first parameter changes with a chip parameter of the quantum chip, and the second parameter does not change with the chip parameter of the quantum chip; determining calibration data corresponding to the first parameter, where the calibration data is determined based on a simulation running error corresponding to the quantum chip; calibrating the first parameter based on the calibration data to obtain a calibrated first parameter; and controlling, based on the calibrated first parameter and the second parameter, the quantum chip to perform an operation.

Further, the second processor 1401 is further configured to execute all or part of the steps in the foregoing embodiments shown in FIG. 6-FIGS. 8A and 8B.

The structure of the electronic device can further include a second communication interface 1403, configured to enable the electronic device to communicate with another device or a communication network.

In addition, the embodiments of the present disclosure provide a computer storage medium, configured to store computer software instructions for use by an electronic device, which include a program for executing the quantum chip control methods in the method embodiments shown in FIG. 6-FIGS. 8A and 8B.

Figure 15:
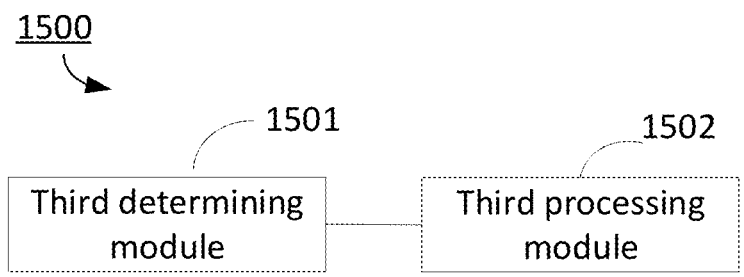
FIG. 15 is a schematic structural diagram of another exemplary parameter calibration apparatus, according to some embodiment of the present disclosure.

FIG. 15 is a schematic structural diagram of another parameter calibration apparatus 1500 according to some embodiment of the present disclosure. Referring to FIG. 15, another parameter calibration apparatus is provided. The parameter calibration apparatus is configured to execute the parameter calibration method 900 shown in FIG. 9. Specifically, the parameter calibration apparatus 1500 can include: a third determining module 1501 and a third processing module 1502.

The third determining module 1501 is configured to determine a processing resource corresponding to a parameter calibration service in response to invoking a parameter calibration request.

The third processing module 1502 is configured to execute the following steps by using the processing resource: obtaining a control parameter to be calibrated; determining a simulation running error corresponding to a quantum chip; determining calibration data corresponding to the control parameter based on the simulation running error; and calibrating the control parameter based on the calibration data to obtain a calibrated control parameter, where the calibrated control parameter is used for controlling operation of the quantum chip.

The apparatus shown in FIG. 15 can execute the method 900 shown in FIG. 9. For parts not described in detail in this example, reference can be made to the relevant descriptions of the example shown in FIG. 9. For the execution process and technical effects of this technical solution, reference can be made to the descriptions in the embodiments shown in FIG. 9, and the details will not be repeated here.

Figure 16:
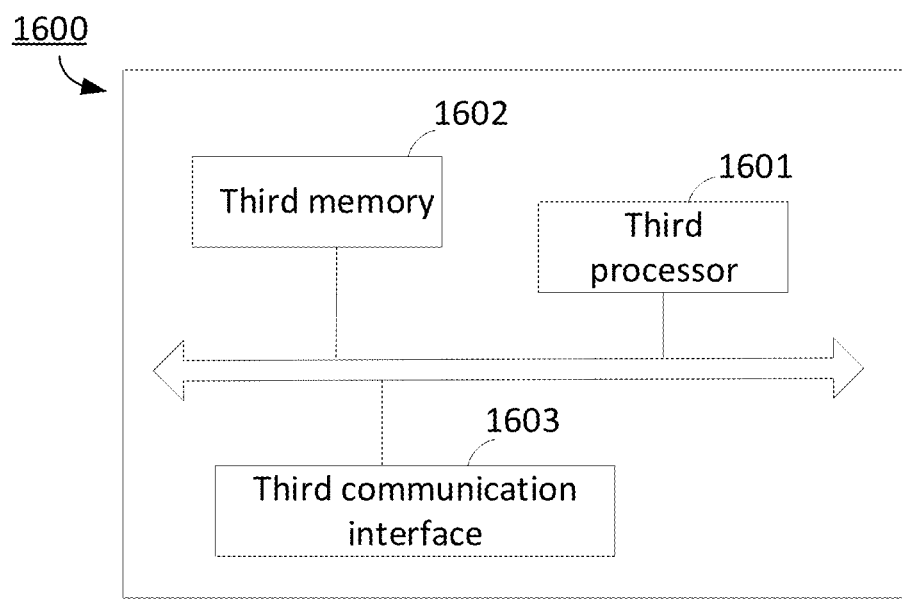
FIG. 16 is a schematic structural diagram of an electronic device corresponding to the parameter calibration apparatus shown in FIG. 15.

In a possible design, the structure of the parameter calibration apparatus shown in FIG. 15 can be implemented as an electronic device. The electronic device can be various devices such as a mobile phone, a tablet computer, a server, etc. As shown in FIG. 16, the electronic device 1600 can include: a third processor 1601 and a third memory 1602.

The third memory 1602 is configured to store a program for causing the electronic device to execute the parameter calibration method provided in the example shown in FIG. 9. The third processor 1601 is configured to execute program stored in the third memory 1602.

The program includes one or more computer instructions. The one or more computer instructions, when executed by the third processor 1601, can implement the following steps: determining a processing resource corresponding to a parameter calibration service in response to invoking a parameter calibration request; and executing the following steps by using the processing resource: obtaining a control parameter to be calibrated; determining a simulation running error corresponding to a quantum chip; determining calibration data corresponding to the control parameter based on the simulation running error; and calibrating the control parameter based on the calibration data to obtain a calibrated control parameter, where the calibrated control parameter is used for controlling operation of the quantum chip.

Further, the third processor 1601 is further configured to execute all or part of the steps in the foregoing method 900 shown in FIG. 9.

The structure of the electronic device can further include a third communication interface 1603, configured to enable the electronic device to communicate with another device or a communication network.

In addition, the embodiments of the present disclosure provide a computer storage medium, configured to store computer software instructions for use by an electronic device, which include a program for executing the parameter calibration method 900 shown in FIG. 9.

Figure 17:
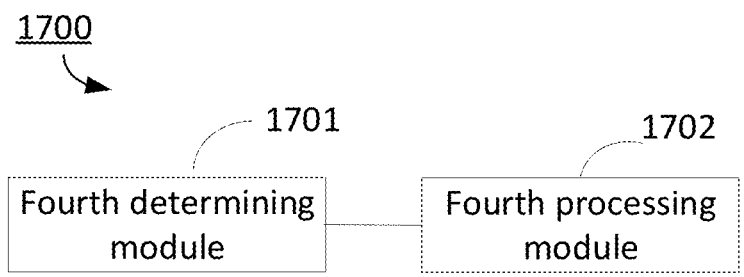
FIG. 17 is a schematic structural diagram of another exemplary quantum chip control apparatus, according to some embodiment of the present disclosure.

FIG. 17 is a schematic structural diagram of another quantum chip control apparatus 1700, according to some embodiments of the present disclosure. Referring to FIG. 17, a quantum chip control apparatus 1700. The quantum chip control apparatus 1700 is configured to execute the quantum chip control method 1000 shown in FIG. 10. Specifically, the quantum chip control apparatus 1700 can include: a fourth determining module 1701 and a fourth processing module 1702.

The fourth determining module 1701 is configured to determine a processing resource corresponding to a quantum chip control service in response to invoking a quantum chip control request.

The fourth processing module 1702 is configured to execute the following steps by using the processing resource: obtaining a first parameter and a second parameter which are used for controlling a quantum chip to perform operations, where the first parameter changes with a chip parameter of the quantum chip, and the second parameter does not change with the chip parameter of the quantum chip; determining calibration data corresponding to the first parameter, where the calibration data is determined based on a simulation running error corresponding to the quantum chip; calibrating the first parameter based on the calibration data to obtain a calibrated first parameter; and controlling, based on the calibrated first parameter and the second parameter, the quantum chip to perform an operation.

The apparatus shown in FIG. 17 can execute the method 1000 shown in FIG. 10. For parts not described in detail in this example, reference can be made to the relevant descriptions of the example shown in FIG. 10. For the execution process and technical effects of this technical solution, reference can be made to the descriptions in the example shown in FIG. 10, and the details will not be repeated here.

Figure 18:
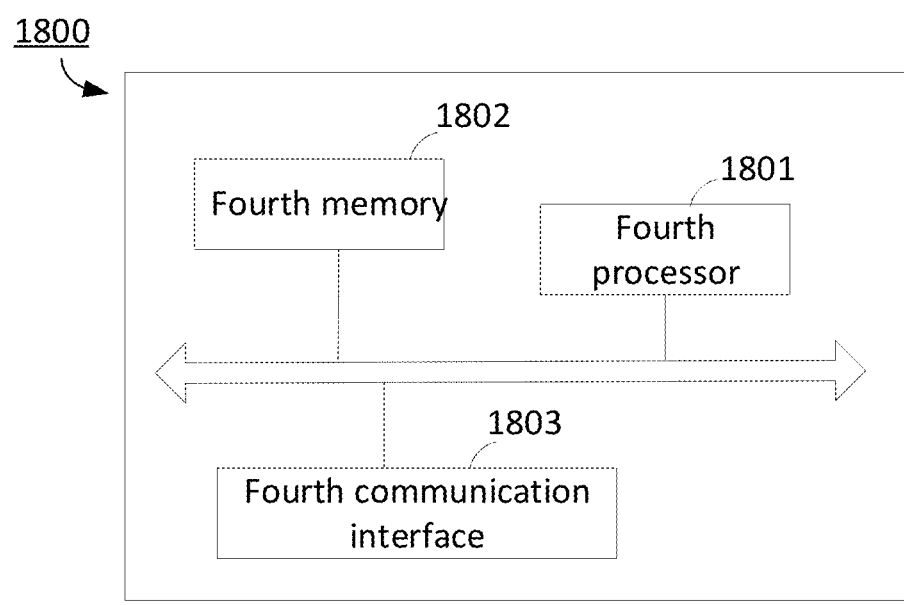
FIG. 18 is a schematic structural diagram of an electronic device corresponding to the quantum chip control apparatus shown in FIG. 17.

In a possible design, the structure of the quantum chip control apparatus shown in FIG. 17 can be implemented as an electronic device. The electronic device can be various devices such as a mobile phone, a tablet computer, a server, etc. As shown in FIG. 18, the electronic device 1800 can include: a fourth processor 1801 and a fourth memory 1802. The fourth memory 1801 is configured to store a program for causing the electronic device to execute the quantum chip control method provided in the method 1000 shown in FIG. 10. The fourth processor 1801 is configured to execute program stored in the fourth memory 1802.

The program includes one or more computer instructions. The one or more computer instructions, when executed by the fourth processor 1801, can implement the following steps: determining a processing resource corresponding to a quantum chip control service in response to invoking a quantum chip control request; and executing the following steps by using the processing resource: obtaining a first parameter and a second parameter which are used for controlling a quantum chip to perform operations, where the first parameter changes with a chip parameter of the quantum chip, and the second parameter does not change with the chip parameter of the quantum chip; determining calibration data corresponding to the first parameter, where the calibration data is determined based on a simulation running error corresponding to the quantum chip; calibrating the first parameter based on the calibration data to obtain a calibrated first parameter; and controlling, based on the calibrated first parameter and the second parameter, the quantum chip to perform an operation.

Further, the fourth processor 1801 is further configured to execute all or part of the steps in the foregoing method 1000 shown in FIG. 10.

The structure of the electronic device can further include a fourth communication interface 1803, configured to enable the electronic device to communicate with another device or a communication network.

In addition, the embodiments of the present disclosure provide a computer storage medium, configured to store computer software instructions for use by an electronic device, which include a program for executing the quantum chip control method 1000 shown in FIG. 10.

Figure 19:
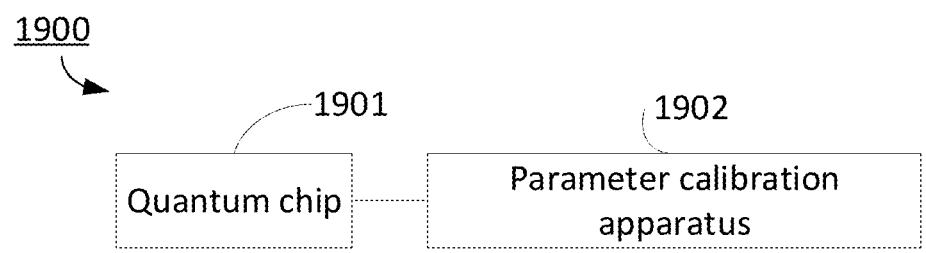
FIG. 19 is a schematic structural diagram of an exemplary parameter calibration system, according to some embodiment of the present disclosure.

FIG. 19 is a schematic structural diagram of a parameter calibration system 1900, according to some embodiments of the present disclosure. As shown in FIG. 19, a parameter calibration system 1900 is provided. The parameter calibration system can include: a quantum chip 1901, and a parameter calibration apparatus 1902. The parameter calibrated apparatus 1902 is connected to the quantum chip 1902, and configured to: obtain a control parameter to be calibrated; determine a simulation running error corresponding to the quantum chip 1901; determine calibration data corresponding to the control parameter based on the simulation running error; and calibrate the control parameter based on the calibration data to obtain a calibrated control parameter, where the calibrated control parameter is used for controlling operation of the quantum chip 1902.

The implementation process, implementation principle, and implementation effects of the parameter calibration system in this example are similar to those of the parameter calibration apparatus 1902 in the foregoing embodiments. Reference can be made to the foregoing descriptions for details, which will not be repeated here.

The embodiments may further be described using the following clauses:

1. A parameter calibration method, comprising:
    obtaining a control parameter to be calibrated;
    determining a simulation running error corresponding to
      a quantum chip;

determining calibration data corresponding to the control parameter to be calibrated based on the simulation running error; and obtaining a calibrated control parameter by calibrating the control parameter to be calibrated using the calibration data, wherein the calibrated control parameter is used for controlling operation of the quantum chip.

2. The method according to clause 1, wherein the control parameter to be calibrated changes with a chip parameter of the quantum chip.

3. The method according to clause 1, wherein determining the simulation running error corresponding to the quantum chip comprises:

obtaining at least one quantum bit included in the quantum chip;

determining a simulation running error corresponding to the at least one quantum bit; and determining the simulation running error corresponding to the quantum chip based on the simulation running error corresponding to the at least one quantum bit.

4. The method according to clause 3, wherein determining the simulation running error corresponding to the at least one quantum bit comprises:

determining a simulated performance parameter and a theoretical performance parameter corresponding to each of the at least one quantum bit; and determining the simulation running error corresponding to the at least one quantum bit based on the simulated performance parameter and the theoretical performance parameter.

5. The method according to clause 4, wherein determining the simulated performance parameter corresponding to each of the at least one quantum bit comprises:

obtaining at least one simulation running parameter used for controlling at least one quantum bit on the quantum chip;

determining a quantum gate precision corresponding to each of the at least one simulation running parameter; and determining the simulated performance parameter corresponding to each of the at least one quantum bit based on the quantum gate precision corresponding to each of the at least one simulation running parameter.

6. The method according to clause 5, wherein different simulation running parameters correspond to a same simulation running error or different simulation running errors.

7. The method according to clause 3, wherein the simulation running error comprises at least one of: a simulation running error corresponding to a chip parameter or a simulation running error corresponding to a control parameter.

8. The method according to clause 2 or 7, wherein the chip parameter comprises at least one of: a capacitance corresponding to the quantum chip, an inductance corresponding to the quantum chip, or a parameter corresponding to the quantum chip and used for characterizing energy stored in a Josephson junction.

9. The method according to any one of clauses 1 to 7, wherein after obtaining the calibrated control parameter, the method further comprises:

obtaining a set control parameter used for controlling the quantum chip, wherein the set control parameter does not change with the chip parameter of the quantum chip; and controlling an operation of the quantum chip based on the set control parameter and the calibrated control parameter.

10. The method according to clause 9, wherein after controlling the operation of the quantum chip based on the set control parameter and the calibrated control parameter, the method further comprises:

determining a quantum gate average precision of the quantum chip; and optimizing the set control parameter and the calibrated control parameter by using a gradient optimization algorithm and the quantum gate average precision.

11. The method according to clause 10, wherein determining the quantum gate average precision of the quantum chip further comprises:

obtaining at least one set error parameter used for controlling at least one quantum bit on the quantum chip;

determining a quantum gate precision corresponding to each of the at least one set error parameter; and averaging all the quantum gate precisions corresponding to the at least one set error parameter to obtain the quantum gate average precision.

12. The method according to clause 10, wherein optimizing the set control parameter and the calibrated control parameter by using the gradient optimization algorithm and the quantum gate average precision further comprises:

performing a reverse differentiation operation on the quantum gate average precision by using the gradient optimization algorithm to obtain a gradient of the set control parameter and a gradient of the calibrated control parameter; and optimizing the set control parameter and the calibrated control parameter respectively based on the gradient of the set control parameter and the gradient of the calibrated control parameter, to obtain a first optimized parameter and a second optimized parameter, wherein the first optimized parameter and the second optimized parameter are used for controlling the quantum chip.

13. A parameter calibration system, comprising:

a quantum chip; and a parameter calibration apparatus, connected to the quantum chip, wherein the parameter calibration apparatus comprises a memory figured to store instructions; and one or more processors configured to execute the instructions to cause the apparatus to perform:

obtain a control parameter to be calibrated;

determine a simulation running error corresponding to the quantum chip;

determine calibration data corresponding to the control parameter to be calibrated based on the simulation running error; and obtain a calibrated control parameter by calibrating the control parameter based on the calibration data, wherein the calibrated control parameter is used for controlling operation of the quantum chip.

14. A quantum chip control method, comprising:

obtaining a first parameter and a second parameter which are used for controlling a quantum chip to perform operations, wherein the first parameter changes with a chip parameter of the quantum chip, and the second parameter does not change with the chip parameter of the quantum chip;

determining calibration data corresponding to the first parameter, wherein the calibration data is determined based on a simulation running error corresponding to the quantum chip;

calibrating the first parameter based on the calibration data to obtain a calibrated first parameter; and controlling, based on the calibrated first parameter and the second parameter, the quantum chip to perform an operation.

15. The method according to clause 14, wherein the first parameter comprises at least one of: a capacitance corresponding to the quantum chip, an inductance corresponding to the quantum chip, or a parameter corresponding to the quantum chip and used for characterizing energy stored in a Josephson junction; and the second parameter comprises a waveform used for controlling the quantum chip to perform an operation.

16. The method according to clause 14 or 15, wherein determining the calibration data corresponding to the first parameter further comprises:

obtaining at least one set error parameter used for controlling at least one quantum bit on the quantum chip;

determining an error corresponding to the quantum chip by controlling the quantum chip based on at least one set error parameter, the first parameter and the second parameter; and determining the calibration data corresponding to the first parameter and the second parameter based on the error corresponding to the quantum chip.

17. The method according to any one of clauses 14 to 16, wherein controlling, based on the calibrated first parameter and the second parameter, the quantum chip to perform an operation is:

controlling, based on an optimized calibrated first parameter and an optimized second parameter, the quantum chip to perform an operation.

18. The method according to clause 17, wherein before controlling, based on the optimized calibrated first parameter and the optimized second parameter, the quantum chip to perform an operation, the method further comprises:

obtaining the optimized calibrated first parameter by optimizing the calibrated first parameter based on a gradient of the calibrated first parameter; and obtaining the optimized calibrated second parameter by optimizing the second parameter based on a gradient of the second parameter.

19. The method according to clause 18, further comprising:

generating at least one quantum gate corresponding to at least one calibrated first parameter;

determining an ideal quantum gate corresponding to the generated at least one quantum gate;

generating a precision of the at least one quantum gate corresponding to the at least one set error parameter based on the generated quantum gate and the ideal quantum gate; and obtaining a quantum gate average precision by averaging all the quantum gate precisions corresponding to all the set error parameters; and performing a reverse differentiation operation on the quantum gate average precision to obtain the gradient of the calibrated first parameter and the gradient of the second parameter using gradient optimization algorithm.

20. The method according to any one of clauses 14 to 19, wherein a quantity of the calibration data is one or more, and a quantity of the calibrated first parameters obtained is the same as the quantity of the calibration data.

21. An apparatus for controlling a quantum chip, the apparatus comprising:

a memory figured to store instructions; and one or more processors configured to execute the instructions to cause the apparatus to perform:

obtaining a first parameter and a second parameter which are used for controlling a quantum chip to perform operations, wherein the first parameter changes with a chip parameter of the quantum chip, and the second parameter does not change with the chip parameter of the quantum chip;

determining calibration data corresponding to the first parameter, wherein the calibration data is determined based on a simulation running error corresponding to the quantum chip;

calibrating the first parameter based on the calibration data to obtain a calibrated first parameter; and controlling, based on the calibrated first parameter and the second parameter, the quantum chip to perform an operation.

22. A non-transitory computer readable medium that stores a set of instructions that is executable by one or more processors of an apparatus to cause the apparatus to initiate a parameter calibration method, the method comprising:

obtaining a control parameter to be calibrated;

determining a simulation running error corresponding to a quantum chip;

determining calibration data corresponding to the control parameter to be calibrated based on the simulation running error; and obtaining a calibrated control parameter by calibrating the control parameter to be calibrated based on the calibration data, wherein the calibrated control parameter is used for controlling operation of the quantum chip.

23. A non-transitory computer readable medium that stores a set of instructions that is executable by one or more processors of an apparatus to cause the apparatus to initiate a quantum chip control method, the method comprising:

obtaining a first parameter and a second parameter which are used for controlling a quantum chip to perform operations, wherein the first parameter changes with a chip parameter of the quantum chip, and the second parameter does not change with the chip parameter of the quantum chip;

determining calibration data corresponding to the first parameter, wherein the calibration data is determined based on a simulation running error corresponding to the quantum chip;

calibrating the first parameter based on the calibration data to obtain a calibrated first parameter; and controlling, based on the calibrated first parameter and the second parameter, the quantum chip to perform an operation.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

The terms used in the embodiments of the present disclosure are merely for the purpose of illustrating specific embodiments, and are not intended to limit the present disclosure. The terms "a", "said" and "the" of singular forms used in the embodiments and the appended claims of the present disclosure are also intended to include plural forms, unless otherwise specified in the context clearly.

The term "and/or" used in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

Depending on the context, for example, words "if" or "as if" used herein may be explained as "while . . . " or "when . . . " or "in response to determining" or "in response to detection". Similarly, depending on the context, phrases "if determining" or "if detecting (a stated condition or event)" may be explained as "when determining" or "in response to determining" or "when detecting (the stated condition or event)" or "in response to detection (the stated condition or event)".

It should be further noted that the terms "include", "contain", and any variants thereof are intended to cover a non-exclusive inclusion. Therefore, a merchandise or a system that includes a series of elements not only includes such elements, but also includes other elements not specified expressly, or but also includes inherent elements of the merchandise or the system. Unless otherwise specified, an element limited by "include a/an . . . " does not exclude other same elements existing in the merchandise or the system that includes the element.

In addition, a step sequence in each of the following method embodiments is merely an example, but not a strict limitation.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the disclosure disclosed herein. It is intended that the specification and examples be considered as exemplary only, with a true scope and spirit of the disclosure being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

It should be understood that the disclosed technical content may be implemented in other ways. The apparatus embodiments described above are only schematic. For example, the division of the units is only a logical function division. In actual implementations, there may be another division manner. For example, multiple units or components may be combined or integrated into another system, or some features can be ignored or not implemented. In addition, the displayed or discussed mutual coupling or direct coupling or communication connection may be indirect coupling or communication connection through some interfaces, units, or modules, which may be in electrical or other forms.

The units described as separate components may or may not be physically separated, and the components displayed as units may or may not be physical units, that is, they may be located in one place or may be distributed to a plurality of network units. Part of or all the units may be selected according to actual needs to achieve the purpose of the solution of the present embodiment.

In addition, the functional units in various embodiments of the present disclosure may be integrated into one processing unit, or each unit may exist alone physically, or two or more units may be integrated into one unit. The integrated units described above may be implemented either in the form of hardware or in the form of a software functional unit.

If the integrated units are implemented in the form of a software functional unit and sold or used as an independent product, they may be stored in a quantum computer-readable storage medium. Based on such an understanding, the technical solutions of the present disclosure essentially, or the part making contributions to the prior art, or all or part of the technical solutions may be embodied in the form of a software product. The quantum computer software product is stored in a storage medium and includes several instructions used for causing a quantum computer device to execute all or part of steps of the methods in various embodiments of the present disclosure.

The above are only preferred implementations of the present disclosure. It should be pointed out that, for those of ordinary skill in the art, several improvements and retouches may further be made without departing from the principles of the present disclosure. These improvements and retouches should also be regarded as the scope of protection of the present specification.

In the drawings and specification, there have been disclosed exemplary embodiments. However, many variations and modifications can be made to these embodiments. Accordingly, although specific terms are employed, they are used in a generic and descriptive sense only and not for purposes of limitation.

What is claimed is:

1. A parameter calibration method, comprising:
   obtaining a control parameter to be calibrated;
   determining a simulation running error corresponding to a quantum chip;
   determining calibration data corresponding to the control parameter to be calibrated based on the simulation running error; and
   obtaining a calibrated control parameter by calibrating the control parameter to be calibrated using the calibration data, wherein the calibrated control parameter is used for controlling operation of the quantum chip.

2. The method according to claim 1, wherein the control parameter to be calibrated changes with a chip parameter of the quantum chip.

3. The method according to claim 1, wherein determining the simulation running error corresponding to the quantum chip comprises:
   obtaining at least one quantum bit included in the quantum chip;
   determining a simulation running error corresponding to the at least one quantum bit; and determining the simulation running error corresponding to the quantum chip based on the simulation running error corresponding to the at least one quantum bit.

4. The method according to claim 3, wherein determining the simulation running error corresponding to the at least one quantum bit comprises:
   determining a simulated performance parameter and a theoretical performance parameter corresponding to each of the at least one quantum bit; and
   determining the simulation running error corresponding to the at least one quantum bit based on the simulated performance parameter and the theoretical performance parameter.

5. The method according to claim 4, wherein determining the simulated performance parameter corresponding to each of the at least one quantum bit comprises:
   obtaining at least one simulation running parameter used for controlling at least one quantum bit on the quantum chip;
   determining a quantum gate precision corresponding to each of the at least one simulation running parameter; and
   determining the simulated performance parameter corresponding to each of the at least one quantum bit based on the quantum gate precision corresponding to each of the at least one simulation running parameter.

6. The method according to claim 5, wherein different simulation running parameters correspond to a same simulation running error or different simulation running errors.

7. The method according to claim 3, wherein the simulation running error comprises at least one of: a simulation running error corresponding to a chip parameter or a simulation running error corresponding to a control parameter.

8. The method according to claim 2, wherein the chip parameter comprises at least one of: a capacitance corresponding to the quantum chip, an inductance corresponding to the quantum chip, or a parameter corresponding to the quantum chip and used for characterizing energy stored in a Josephson junction.

9. The method according to claim 1, wherein after obtaining the calibrated control parameter, the method further comprises:
   obtaining a set control parameter used for controlling the quantum chip, wherein the set control parameter does not change with the chip parameter of the quantum chip; and
   controlling an operation of the quantum chip based on the set control parameter and the calibrated control parameter.

10. The method according to claim 9, wherein after controlling the operation of the quantum chip based on the set control parameter and the calibrated control parameter, the method further comprises:
    determining a quantum gate average precision of the quantum chip; and
    optimizing the set control parameter and the calibrated control parameter by using a gradient optimization algorithm and the quantum gate average precision.

11. The method according to claim 10, wherein determining the quantum gate average precision of the quantum chip further comprises:
    obtaining at least one set error parameter used for controlling at least one quantum bit on the quantum chip;
    determining a quantum gate precision corresponding to each of the at least one set error parameter; and
    averaging all the quantum gate precisions corresponding to the at least one set error parameter to obtain the quantum gate average precision.

12. The method according to claim 10, wherein optimizing the set control parameter and the calibrated control parameter by using the gradient optimization algorithm and the quantum gate average precision further comprises:
    performing a reverse differentiation operation on the quantum gate average precision by using the gradient optimization algorithm to obtain a gradient of the set control parameter and a gradient of the calibrated control parameter; and
    optimizing the set control parameter and the calibrated control parameter respectively based on the gradient of the set control parameter and the gradient of the calibrated control parameter, to obtain a first optimized parameter and a second optimized parameter, wherein the first optimized parameter and the second optimized parameter are used for controlling the quantum chip.

13. A parameter calibration system, comprising:
    a quantum chip; and
    a parameter calibration apparatus, connected to the quantum chip, wherein the parameter calibration apparatus comprises a memory configured to store instructions; and one or more processors configured to execute the instructions to cause the apparatus to perform:
    obtain a control parameter to be calibrated;
    determine a simulation running error corresponding to the quantum chip;
    determine calibration data corresponding to the control parameter to be calibrated based on the simulation running error; and
    obtain a calibrated control parameter by calibrating the control parameter based on the calibration data, wherein the calibrated control parameter is used for controlling operation of the quantum chip.

14. A quantum chip control method, comprising:
    obtaining a first parameter and a second parameter that are used for controlling a quantum chip to perform operations, wherein the first parameter changes with a chip parameter of the quantum chip, and the second parameter does not change with the chip parameter of the quantum chip;
    determining calibration data corresponding to the first parameter, wherein the calibration data is determined based on a simulation running error corresponding to the quantum chip;
    calibrating the first parameter based on the calibration data to obtain a calibrated first parameter; and
    controlling, based on the calibrated first parameter and the second parameter, the quantum chip to perform an operation.

15. The method according to claim 14, wherein the first parameter comprises at least one of: a capacitance corresponding to the quantum chip, an inductance corresponding to the quantum chip, or a parameter corresponding to the quantum chip and used for characterizing energy stored in a Josephson junction; and the second parameter comprises a waveform used for controlling the quantum chip to perform an operation.

16. The method according to claim 14, wherein determining the calibration data corresponding to the first parameter further comprises:
    obtaining at least one set error parameter used for controlling at least one quantum bit on the quantum chip;

determining an error corresponding to the quantum chip by controlling the quantum chip based on at least one set error parameter, the first parameter and the second parameter; and determining the calibration data corresponding to the first parameter and the second parameter based on the error corresponding to the quantum chip.

17. The method according to claim 16, wherein controlling, based on the calibrated first parameter and the second parameter, the quantum chip to perform an operation is:

controlling, based on an optimized calibrated first parameter and an optimized second parameter, the quantum chip to perform an operation.

18. The method according to claim 17, wherein before controlling, based on the optimized calibrated first parameter and the optimized second parameter, the quantum chip to perform an operation, the method further comprises:

obtaining the optimized calibrated first parameter by optimizing the calibrated first parameter based on a gradient of the calibrated first parameter; and obtaining the optimized calibrated second parameter by optimizing the second parameter based on a gradient of the second parameter.

19. The method according to claim 18, wherein controlling, based on the optimized calibrated first parameter and the optimized second parameter, the quantum chip to perform an operation further comprises:

generating at least one quantum gate corresponding to at least one calibrated first parameter;

determining an ideal quantum gate corresponding to the generated at least one quantum gate;

generating a precision of the at least one quantum gate corresponding to the at least one set error parameter based on the generated quantum gate and the ideal quantum gate; and obtaining a quantum gate average precision by averaging all the quantum gate precisions corresponding to all the set error parameters; and performing a reverse differentiation operation on the quantum gate average precision to obtain the gradient of the calibrated first parameter and the gradient of the second parameter using gradient optimization algorithm.

20. The method according to claim 14, wherein a quantity of the calibration data is one or more, and a quantity of the calibrated first parameters obtained is the same as the quantity of the calibration data.

* * * * *